(12) United States Patent
Futase et al.

(10) Patent No.: US 7,851,355 B2
(45) Date of Patent: Dec. 14, 2010

(54) METHOD OF MANUFACTURING SEMICONDUCTOR DEVICE

(75) Inventors: Takuya Futase, Tokyo (JP); Hiroshi Tobimatsu, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 549 days.

(21) Appl. No.: 11/749,289

(22) Filed: May 16, 2007

(65) Prior Publication Data
US 2007/0269976 A1    Nov. 22, 2007

(30) Foreign Application Priority Data
May 18, 2006    (JP)    .............. 2006-138949

(51) Int. Cl.
*H01L 21/4763*    (2006.01)
(52) U.S. Cl. ..................................... 438/637; 438/660
(58) Field of Classification Search ................ 438/637, 438/660
See application file for complete search history.

(56) References Cited

U.S. PATENT DOCUMENTS

| 5,030,319 | A | 7/1991 | Nishino et al. |
| 6,864,183 | B2 | 3/2005 | Maekawa |
| 2002/0036066 | A1* | 3/2002 | Ogawa et al. ............... 156/345 |
| 2004/0097088 | A1* | 5/2004 | Kitayama et al. ........... 438/694 |
| 2005/0230350 | A1 | 10/2005 | Kao et al. |
| 2005/0266684 | A1* | 12/2005 | Lee et al. ..................... 438/653 |
| 2006/0137607 | A1* | 6/2006 | Seo et al. .................... 118/715 |

FOREIGN PATENT DOCUMENTS

| JP | 02-256235 | 10/1990 |
| JP | 03-116727 | 5/1991 |
| JP | 2003-324108 | 11/2003 |

* cited by examiner

*Primary Examiner*—Bradley K Smith
*Assistant Examiner*—Marvin Payen
(74) *Attorney, Agent, or Firm*—Antonelli, Terry, Stout & Kraus, LLP.

(57) ABSTRACT

To provide a technology capable of improving reliability and manufacturing yield of a semiconductor device by reducing variations of electrical characteristics in connection hole portions. After a semiconductor wafer is placed over a wafer stage provided in a chamber for dry cleaning treatment of a deposition system, dry cleaning treatment is performed to a principal surface of the semiconductor wafer by supplying reducing gas, sequentially, heat treatment is performed to the semiconductor wafer at a first temperature of 100 to 150° C. by a showerhead which is maintained at 180° C. Next, after the semiconductor wafer is vacuum transferred from the chamber to a chamber for heat treatment, heat treatment is performed to the semiconductor wafer at a second temperature of 150 to 400° C. in the chamber, thereby removing a product remaining over the principal surface of the semiconductor wafer.

11 Claims, 14 Drawing Sheets

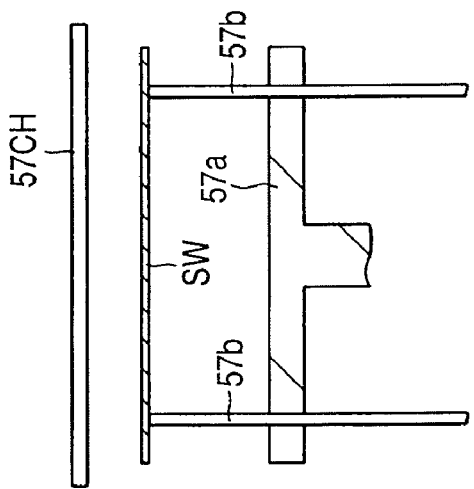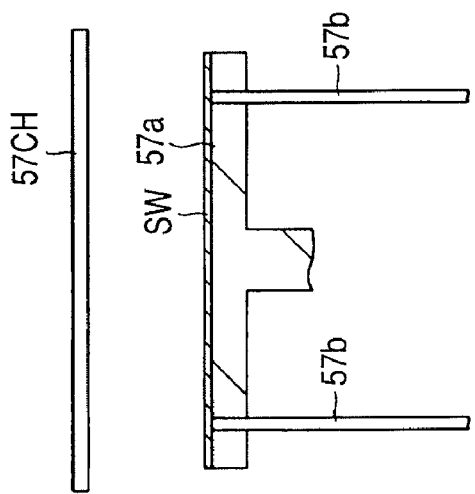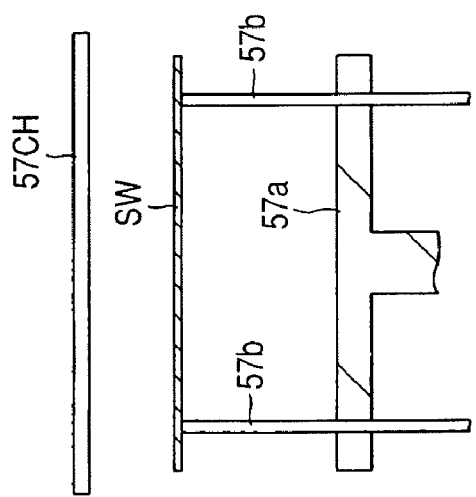

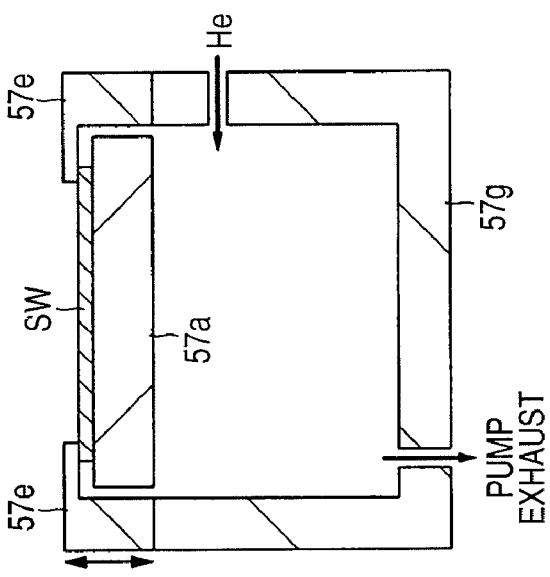
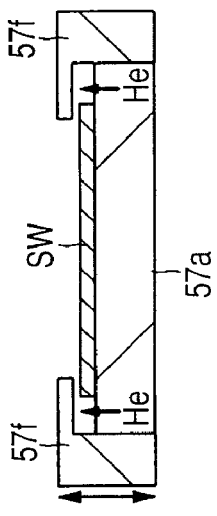
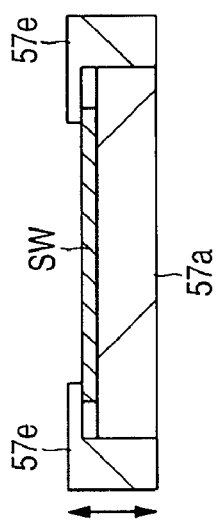

METHOD OF MANUFACTURING SEMICONDUCTOR DEVICE

CROSS-REFERENCE TO RELATED APPLICATIONS

The disclosure of Japanese Patent Application No. 2006-138949 filed on May 18, 2006 including the specification, drawings and abstract is incorporated herein by reference in its entirety.

BACKGROUND OF THE INVENTION

The invention relates to a manufacturing technology of a semiconductor device, particularly, relates to a technology which is effective when applied to manufacturing processes of a semiconductor device in which a metal film is embedded into connection holes opened in an insulating film.

BACKGROUND ART

In Japanese Patent Application Laid-open No. 2003-324108 (corresponding to U.S. Pat. No. 6,864,183), a method of removing a natural oxide film existing at the surface of a silicon substrate and a gate electrode is enclosed, which is performed by plasma etching using mixed gas of argon gas and at least one or more kinds of fluoride gasses selected from a group including nitrogen trifluoride gas, hydrogen fluoride gas, two-carbon hexafluoride gas, carbon tetrafluoride gas, and sulfur hexafluoride gas.

In Japanese Patent Application Laid-open No. 2-256235 (corresponding to U.S. Pat. No. 5,030,319), a method of selectively etching and removing an oxide film without causing damage to the base is disclosed, in which haloid salt is generated by gas including halogen elements and basic gas to make it react with the oxide film of a subject to be treated, or haloid salt gas is made to react with the oxide film directly.

In addition, in Japanese Patent Application Laid-open No. 3-116727, a cleaning method is disclosed, in which, after a semiconductor substrate in which an oxide film is formed at the surface thereof is exposed in gas including fluorine atoms, the oxide film is removed by annealing in reducing gas, inert gas or in a vacuum.

As high integration of a semiconductor device makes progress, a field effect transistor is miniaturized according to a scaling law, and it is required to have an aperture of 0.1 μm or less in connection holes formed in an interlayer insulating film for connecting a gate or sources/drain to wiring. However, on the surface of a conductive material exposed at the bottoms of the connection holes (for example, the surface of a conductive film forming a gate, a semiconductor region in which source/drain are formed or a silicide layer formed over the conductive film or the semiconductor region), a natural oxide film tends to be formed, and it is necessary to remove the natural oxide film to have good conduction when a metal film is embedded into the connection holes. Especially, in the minute connection holes having an aperture of 0.1 μm or less, it is difficult to remove the natural oxide film at the bottoms of the connection holes, therefore, various cleaning methods or processing apparatuses are proposed in the related arts.

The thickness of the natural oxide film formed at the bottoms of the connection holes varies. Therefore, as a method for removing the natural oxide film or impurities at the bottoms of the connection holes without overetching, the present inventors perform dry cleaning treatment using reducing gas such as HF gas and $NH_3$ gas, or $NF_3$ gas and $NH_3$ gas, or dry cleaning treatment using reactive plasma of Ar gas including reducing gas such as $NF_3$ gas and $NH_3$ gas or $NF_3$ gas and $H_2$ gas, after forming the connection holes.

However, there are various kinds of technological problems explained below in the above dry cleaning treatment.

At the bottoms and side surfaces of the connection holes to which dry cleaning treatment has been performed, ammonium silicofluoride (($NH_4)_2SiF_6$) is generated. In general, a metal film to be a main conductive material is embedded in the connection holes through a barrier metal film (for example, a stacked film in which a titanium nitride film is stacked over a titanium film). When the product remains, there arise problems such as variations of contact resistance between the barrier metal film and the conductive material thereunder at the bottoms of the connection holes, and peeling of the barrier metal film at the side surfaces of the connection holes.

An experiment was performed, in which the product is removed from the bottoms and the side surfaces of the connection holes by heating connection hole portions to which dry cleaning treatment has been performed at approximately 100° C. which is the sublimation temperature of the product. However, it was found that it is not possible to sublime the product completely even when the connection hole portions are heated at approximately 100° C. and it is difficult to avoid the problems. It is considered that this is because the composition of the product generated at the bottoms and the side surfaces of the connection holes includes not only ($NH_4)_2SiF_6$ but also includes the composition which is slightly different from ($NH_4)_2SiF_6$ (chemical compounds of non-stoichiometric composition, when these are not confusing, they are indicated as ammonium silicofluoride or ($NH_4)_2SiF_6$ for convenience). The product whose composition is slightly different does not sublime at the temperature of approximately 100° C. and remains at the bottoms and the side surfaces of the connection holes.

SUMMARY OF THE INVENTION

An object of one invention of the present application is to provide a technology which improves reliability and manufacturing yield of a semiconductor device by reducing variations in electrical characteristics in the connection hole portions.

The above and other objects of the one invention of the application, and objects and novel characteristics of other inventions will be clarified from description of the specification and the attached drawings.

Summaries of typical inventions in inventions disclosed in the application will be briefly explained as follows.

A method of manufacturing a semiconductor device according to the invention includes, before forming a barrier metal film inside connection holes opening in an insulating film, a step of placing a semiconductor wafer over a wafer stage provided in a first chamber, a step of performing dry cleaning treatment to insides of the connection holes by supplying reducing gas through a showerhead set above the wafer stage, a step of performing heat treatment to the semiconductor wafer at a first temperature of 100 to 150° C. utilizing a heating temperature of the showerhead, a step of transferring the semiconductor wafer from the first chamber to a second chamber, and a step of performing heat treatment to the semiconductor wafer at a second temperature of 150 to 400° C. in the second chamber.

A method of manufacturing the semiconductor device according to the invention includes, before forming a barrier metal film inside connection holes opening in an insulating film, a step of placing a semiconductor wafer over a wafer stage provided in a first chamber, a step of performing dry cleaning treatment to insides of the connection holes by supplying reducing gas through a showerhead set above the wafer stage, and a step of performing heat treatment to the semiconductor wafer at a first temperature of 180 to 220° C. utilizing a heating temperature of the showerhead.

A method of manufacturing the semiconductor device according to the invention includes, before forming a barrier metal film inside connection holes opening in an insulating film, a step of placing a semiconductor wafer over a wafer stage provided in a first chamber, a step of performing dry cleaning treatment to insides of the connection holes by supplying reducing gas through a showerhead set above the wafer stage, without performing dry cleaning treatment to the side surface and the rear surface of the semiconductor wafer, a step of transferring the semiconductor wafer from the first chamber to a second chamber, and a step of performing heat treatment to the semiconductor wafer at a second temperature of 150 to 400° C. in the second chamber.

Summaries of the invention other than the above (including similar ones) disclosed in the application will be described according to paragraphs.

1. A method of manufacturing a semiconductor device in which a metal film is embedded inside connection holes opening in an insulating film through a barrier metal film, including the following steps, before depositing the barrier metal film inside the connection holes after forming the connection holes in the insulating film, (a) placing a semiconductor wafer over a wafer stage provided in a first chamber; (b) performing dry cleaning treatment to insides of the connection holes by supplying reducing gas through a showerhead set above the wafer stage; (c) performing a first heat treatment to the semiconductor wafer at a first temperature utilizing a heating temperature of the showerhead (such as radiation of the showerhead); (d) transferring the semiconductor wafer from the first chamber to a second chamber; and (e) performing a second heat treatment to the semiconductor wafer at a second temperature higher than the first temperature in the second chamber.

Though cleaning processes inside connection holes before forming the barrier metal have been chiefly described, it goes without saying that respective processes of subparagraphs in sections 1, 8 and 11 can be applied as pre-processing (dry cleaning) for other wafer processing.

Specifically, when performing dry cleaning as a cleaning before wafer processing such as heat treatment or formation of various films (for example, processing of transforming a natural oxide film at the surface of silicon into materials which will sublime, evaporate or vaporize at a relatively low temperature (for example, 400 degrees Celsius or less)), heat treatment at a first temperature (temperature at the upper surface of the wafer) is performed to cleaning residuals (including cleaning processing products) generated as a result of dry cleaning and deposited, condensed or coagulated at the surface of a wafer (including the upper surface, the side surface and the rear surface) at the same chamber as a dry cleaning chamber, utilizing a part or all of a cleaning mechanism, thereby vaporizing a part of the cleaning residuals to be removed, then, the wafer is transferred to another processing chamber, where remaining residuals are vaporized by performing the heat treatment at a second temperature (temperature at the upper surface of the wafer) higher than the first temperature.

Since the first heat treatment can be performed at a relatively low temperature, there are advantages that the system structure can be relatively simple or that throughput can be secured. In addition, there is an advantage that residuals at the rear surface and the side surface which is necessary for handling can be removed relatively completely (to the extent that pollution diffusion by the handling is avoided) by the treatment. The reason why the second heating treatment is necessary is that there is a case in which a vaporization temperature increases when the products include non-stoichiometry composition, and that there is a case in which an effective vaporization temperature increases depending on physiographic characteristics on the upper surface of the actual wafer having complicated structure.

2. In the method of manufacturing the semiconductor device according to the first aspect of the invention, the first temperature is 100° C. or more and below 150° C.

3. In the method of manufacturing the semiconductor device according to the first aspect of the invention, the second temperature is 150 to 400° C.

4. In the method of manufacturing the semiconductor device according to the first aspect of the invention, the second temperature is 165 to 350° C.

5. In the method of manufacturing the semiconductor device according to the first aspect of the invention, the second temperature is 180 to 220° C.

6. In the method of manufacturing the semiconductor device according to the first aspect of the invention, the second temperature is 200° C.

7. In the method of manufacturing the semiconductor device according to the first aspect of the invention, transfer of the semiconductor wafer between the first chamber and the second chamber is performed by vacuum transfer.

8. A method of manufacturing a semiconductor device in which a metal film is embedded inside connection holes opening in an insulating film through a barrier metal film, including the steps of, before depositing the barrier metal film inside the connection holes after forming the connection holes in the insulating film: (a) placing a semiconductor wafer over a wafer stage provided in a first chamber; (b) performing dry cleaning treatment to the surface of silicon over a principal surface of the semiconductor wafer by supplying reducing gas through a showerhead set above the wafer stage; (c) performing a first heat treatment to the semiconductor wafer at a first temperature utilizing a heating temperature of the showerhead, in which the showerhead is maintained at a higher temperature than 180° C.

Specifically, when performing dry cleaning as a cleaning before wafer processing such as heat treatment or formation of various films (for example, processing of transforming a natural oxide film at the surface of silicon into materials which will sublime, evaporate or vaporize at a relatively low temperature (for example, 400 degrees Celsius or less)), heat treatment at a sufficiently high temperature (temperature of the upper surface of the wafer) is performed to cleaning residuals (including cleaning processing products) generated as a result of dry cleaning and deposited, condensed or coagulated at the surface of a wafer (including the upper surface, the side surface and the rear surface) at the same chamber as a dry cleaning chamber, utilizing a part or all of a cleaning mechanism, thereby vaporizing almost the whole of cleaning residuals to be removed.

In this case, there is an advantage that the processing chamber of the system can be effectively used since the processing can be performed at one heat treatment and at the same chamber.

9. In the method of manufacturing the semiconductor device according to the eighth aspect of the invention, the first temperature is 180 to 220° C.

10. In the method of manufacturing the semiconductor device according to the eighth aspect of the invention, the first temperature is 200° C.
11. A method of manufacturing a semiconductor device in which a metal film is embedded inside connection holes opening in an insulating film through a barrier metal film, including the steps of, before depositing the barrier metal film inside the connection holes after forming the connection holes in the insulating film: (a) placing a semiconductor wafer over a wafer stage provided in a first chamber; (b) performing dry cleaning treatment to insides of the connection holes by supplying reducing gas through a showerhead set above the wafer stage; (c) transferring the semiconductor wafer from the first chamber to a second chamber; and (d) performing heat treatment (correspond to the above second heat treatment in the paragraph 1) to the semiconductor wafer at a second temperature in the second chamber, in which the reducing gas is not supplied at the side surface and the rear surface of the semiconductor wafer in the step (b).

Specifically, when performing dry cleaning as a cleaning before wafer processing such as heat treatment or formation of various films (for example, processing of transforming a natural oxide film at the surface of silicon into materials which will sublime, evaporate or vaporize at a relatively low temperature (for example, 400 degrees Celsius or less)), heat treatment at a sufficiently high temperature (temperature at the upper surface of the wafer) is performed to cleaning residuals (including cleaning processing products) generated as a result of dry cleaning and deposited, condensed or coagulated at the surface of a wafer (at this time, it is necessary to perform dry cleaning so that the deposit does not adhere to a peripheral portion in the upper surface, the side surface and the rear surface) at a different chamber from a dry cleaning chamber, thereby vaporizing almost the whole of cleaning residuals to be removed.

12. In the method of manufacturing the semiconductor device according to the eleventh aspect of the invention, the second temperature is 150 to 400° C.
13. In the method of manufacturing the semiconductor device according to the eleventh aspect of the invention, the second temperature is 165 to 350° C.
14. In the method of manufacturing the semiconductor device according to the eleventh aspect of the invention, the second temperature is 180 to 220° C.
15. In the method of manufacturing the semiconductor device according to the eleventh aspect of the invention, the second temperature is 200° C.
16. In the method of manufacturing the semiconductor device according to the eleventh aspect of the invention, the step (b) includes the following step of: (b1) pressing a peripheral portion of the semiconductor wafer placed over the wafer stage by a sealing.
17. In the method of manufacturing the semiconductor device according to the eleventh aspect of the invention, the step (b) includes the following steps of: (b1) sucking the semiconductor wafer over the wafer stage by an electrostatic chuck; and (b2) covering a peripheral portion of the semiconductor wafer with a shadow ring without touching the semiconductor wafer, and allowing inert gas to flow in from the peripheral portion of the wafer stage.
18. In the method of manufacturing the semiconductor device according to the eleventh aspect of the invention, the step (b) includes the following steps of: (b1) pressing a peripheral portion of the semiconductor wafer placed over the wafer stage by a sealing; and (b2) allowing inert gas to flow in from the rear surface side of the wafer stage.
19. In the method of manufacturing the semiconductor device according to the eleventh aspect of the invention, transfer of the semiconductor wafer between the first chamber and the second chamber is performed by vacuum transfer.
20. In the method of manufacturing the semiconductor device according to the first, eighth or eleventh aspect of the invention, the metal film is a tungsten film, and the barrier metal film is a stacked film in which a titanium nitride film is stacked over a titanium film or a tungsten nitride film.
21. In the method of manufacturing the semiconductor device according to the first, eighth or eleventh aspect of the invention, the metal film is a copper film, and the barrier metal film is a titanium nitride film, a tantalum nitride film, a stacked film in which a tantalum film is stacked over the tantalum nitride film or a stacked film in which a ruthenium film is staked over the tantalum nitride film.
22. In the method of manufacturing the semiconductor device according to the first, eighth or eleventh aspect of the invention, the metal film is an aluminum film, and the barrier metal film is a stacked film in which a titanium nitride film is stacked over a titanium film or a tungsten nitride film.

Advantages obtained by typical inventions in inventions disclosed in the application will be briefly explained as follows.

Since it is possible to reduce variations of electrical characteristics in connection hole portions, reliability and manufacturing yield of a semiconductor device can be improved.

BRIEF DESCRIPTION OF THE DRAWINGS

FIGS. 16A, 16B and 16C are respectively schematic cross-sectional views of a chamber for explaining processing steps of a semiconductor wafer in the chamber for dry cleaning treatment provided in a barrier metal film deposition system according to the second embodiment of the invention;

FIGS. 17A, 17B and 17C are respectively schematic cross-sectional views of chambers for dry cleaning treatment provided in a barrier metal film deposition system according to a third embodiment of the invention.

DESCRIPTION OF THE PREFERRED EMBODIMENTS

Figure 1:
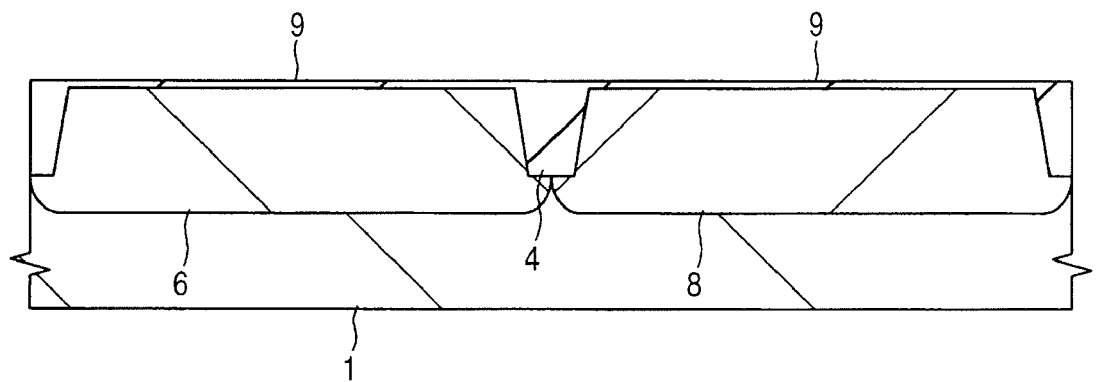
FIG. 1 is a cross-sectional view of relevant parts of the semiconductor substrate showing a manufacturing step of a CMOS device according to a first embodiment of the invention.

In the embodiments, explanations are performed by dividing into a plurality of sections or embodiments if necessary for convenience, however, these are not irrelevant to one another except the case particularly shown clearly, one section has relations of a modification example, details, an additional explanation and the like for a part or the whole of the other section. In the embodiments, when mentioning the number of elements and the like (including the number, values, amounts, range and the like), it is not limited to the particular number, and may be more than or less than the particular number except the case particularly shown clearly or the case clearly limited to the particular number in principle. Furthermore, in the embodiments, it goes without saying that structural components thereof (including component steps) are not always essential except the case particularly shown clearly or the case considered to be essential in principle. In the same way, in the embodiments, when mentioning shapes, positional relations and the like of structural components and the like, the one substantially approximate, similar to the shape and the like are included except the case particularly shown clearly or the case considered to be obviously different in principle. This is applied to the values and the range in the same manner.

In the embodiments, a MIS/FET (Metal Insulator Semiconductor Field Effect Transistor) representing a field effect transistor is abbreviated to MIS, a p-channel type MIS/FET is abbreviated to pMIS, and an n-channel type MIS/FET is abbreviated to nMIS. Even when written as MOS for convenience, non-oxide films are not excluded. Additionally, in the embodiments, a wafer chiefly indicates a Si (Silicon) single crystalline wafer, however, it is not limited to this, and also widely indicates a SOI (Silicon On Insulator) wafer, an insulating film substrate for forming an integrated circuit thereover and the like. The shape thereof is not limited to a circle or an almost circle but also includes a square, a rectangle and the like. Further, a silicon film, a silicon portion, a silicon member and the like include not only pure silicon but also ones including additives such as ones including impurities and alloy and the like (including strained silicon) having silicon such as SiGe or SiGeC as one of main components, except the case considered to be clearly different or the case in which that it is clearly different is shown. Also, needless to say, the polycrystalline silicon and the like includes not only typical ones but also includes an amorphous silicon and the like, except the case considered to be clearly different or the case in which that it is clearly different is shown.

In all drawings for explaining the embodiments, the same numerals and signs are put to components having the same function, and repeated explanations are omitted. Hereinafter, embodiments of the present invention will be explained in details with reference to the drawings.

Concerning dry cleaning technology, it is disclosed in Japanese Patent Application No. 2006-3704 (filed on Jan. 11, 2006) by Mr. Ichinose et alia, Japanese Patent Application No. 2006-12355 (filed on Jan. 20, 2006), Japanese Patent Application No. 2006-107780 (filed on Apr. 10, 2006), therefore, contents overlapping with the above will not be repeated in principle.

First Embodiment

Figure 6:
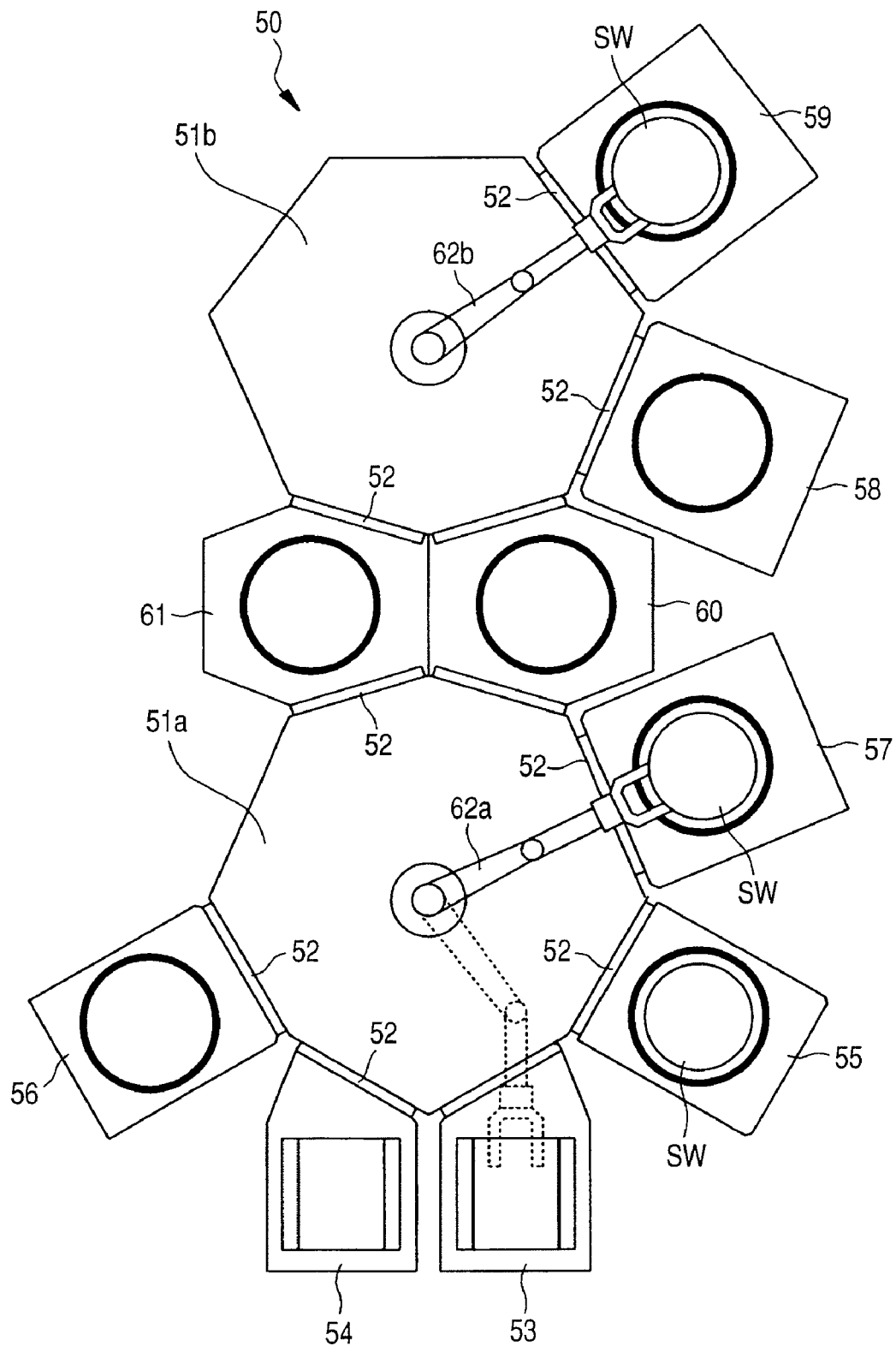
FIG. 6 is a schematic plan view of a barrier metal film deposition system according to the first embodiment of the invention.
Figure 7:
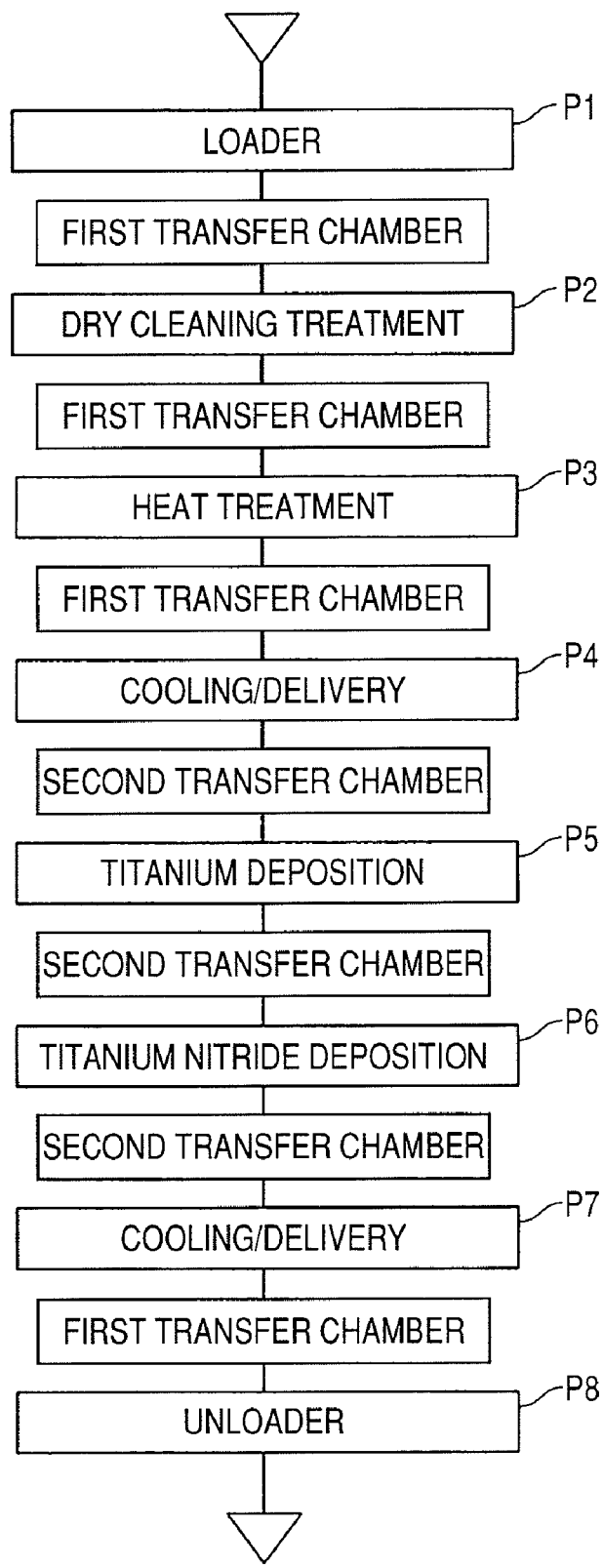
FIG. 7 is a chart of deposition steps of the barrier metal film according to the first embodiment of the invention.
Figure 8:
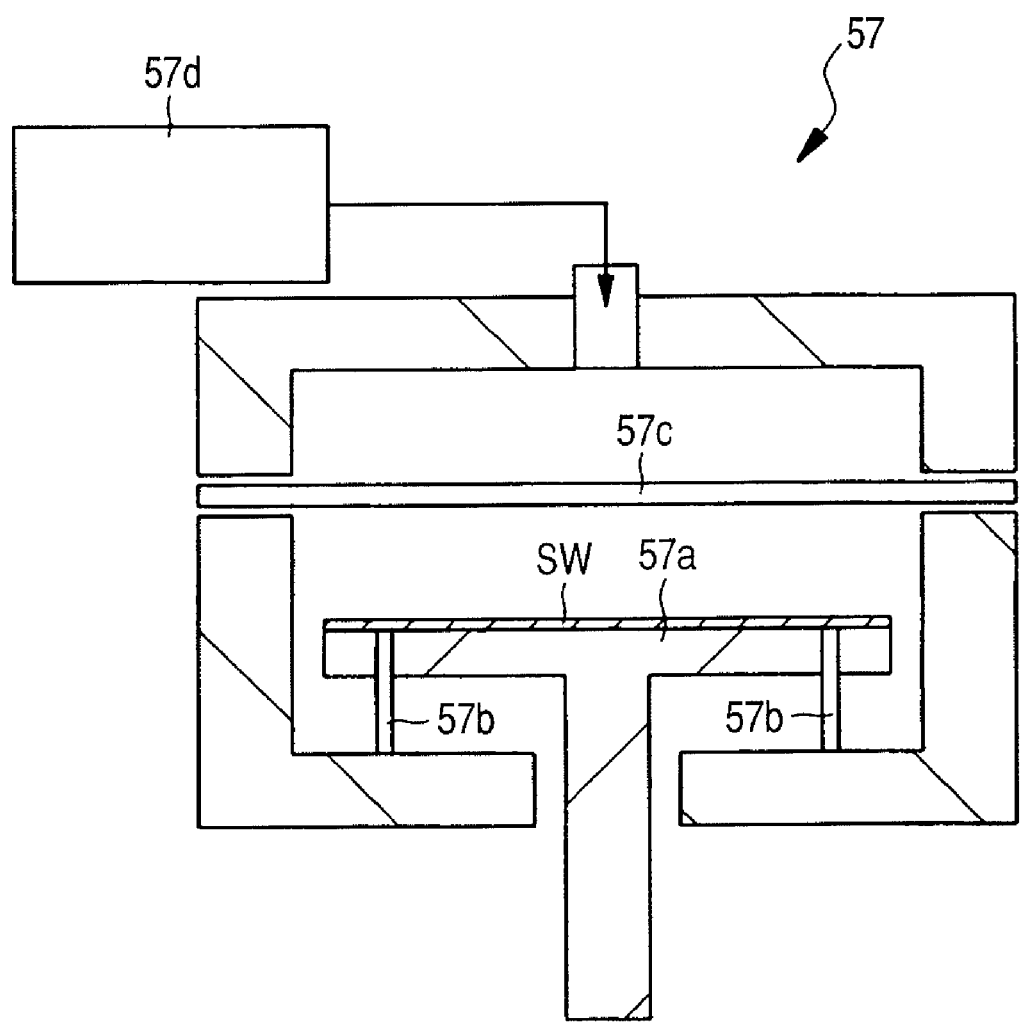
FIG. 8 is a schematic cross-sectional view of a chamber for dry cleaning treatment included in the barrier metal film deposition system according to the first embodiment of the invention.

A method of manufacturing a CMOS (Complementary Metal Oxide Semiconductor) device according to a first embodiment of the invention will be explained with reference to FIG. 1 to FIG. 14. FIG. 1 to FIG. 5A and FIG. 5B, and FIG. 11 to FIG. 14 show cross-sectional views of relevant parts of the CMOS device, FIG. 6 is a schematic plan view of a barrier-metal deposition system, FIG. 7 is a chart of deposition steps of the barrier-metal film, FIG. 8 is a schematic cross-sectional view of a chamber for dry cleaning treatment provided in the barrier metal deposition system, FIGS. 9A, 9B and 9C respectively show schematic cross-sectional views of the chamber for explaining processing steps of a semiconductor wafer in the chamber for dry cleaning treatment provided in the barrier-metal film deposition system, and FIG. 10 is a graph showing the relation between electric current flowing in a gate electrode and a semiconductor substrate, and the heat treatment temperature in the case that dry cleaning treatment and heat treatment are performed to the semiconductor substrate after forming an nMIS.

First, as shown in FIG. 1, a semiconductor substrate 1 (a semiconductor thin plate having an approximately circular planar shape which is called as a semiconductor wafer) including, for example, p-type single crystalline silicon is prepared. Next, an element isolation region 4 is formed over a principal surface of the semiconductor substrate 1. The element isolation region 4 is formed, in which a trench having the depth of 0.35 μm is formed by etching the semiconductor substrate 1, subsequently, an insulating film such as a silicon oxide film is deposited over the principal surface of the semiconductor substrate 1 by a CVD (Chemical Vapor Deposition) method, then, the silicon oxide film at the outside of the trench is removed by a CMP (Chemical Mechanical Polishing) method.

Next, a p-type well 6 is formed by ion-implanting a p-type impurity, for example, boron (B) into an nMIS forming region of the semiconductor substrate 1, and an n-type well 8 is formed by ion-implanting an n-type impurity, for example, phosphorus (P) into a pMIS forming region of the semiconductor substrate 1. After that, it is also preferable to perform ion-implantation of an impurity for controlling the threshold value of the nMIS or the pMIS into the p-type well 6 or the n-type well 8.

Next, after the surface of the semiconductor substrate 1 is cleaned, for example, by a wet etching using hydrofluoric acid, the semiconductor substrate 1 is thermally oxidized to form a gate insulating film 9 having a thickness of, for example, 5 nm over the surface (respective surfaces of the p-type well 6 and the n-type well 8) of the semiconductor substrate 1.

Figure 2:
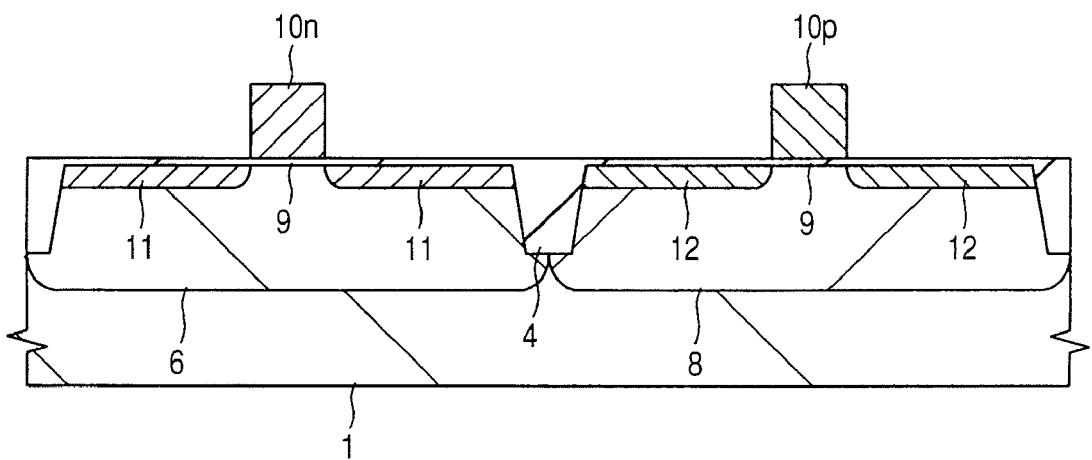
FIG. 2 is a cross-sectional view of relevant parts at the same place as FIG. 1 during a manufacturing step of the CMOS device, continued from FIG. 1.

Next, as shown in FIG. 2, after a conductive film for gate electrodes having a thickness of, for example, 0.2 μm over the gate insulating film 9, the conductive film for gate electrodes is processed by dry etching using a resist pattern as a mask to form gate electrodes 10n, 1op including the conductive film. The conductive film for gate electrodes is made of, for example, a polycrystalline silicon film formed by the CVD method. The gate electrode 10n including the polycrystalline silicon film in which the n-type impurity is introduced is formed in the nMIS forming region, and gate electrode 10p including the polycrystalline silicon film in which the p-type impurity is introduced is formed in the pMIS forming region.

Next, an n-type impurity, for example, arsenic (As) is ion-implanted into the p-type well 6 to form a source/drain extension region 11 having relatively low concentration in a manner of self alignment with respect to the gate electrode 10n of the nMIS. Similarly, a p-type impurity, for example, boron fluoride ($BF_2$) is ion implanted into the n-type well 8 to form a source/drain extension region 12 having relatively low concentration in a manner of self alignment with respect to the gate electrode 10p of the pMIS. The depth of the source/drain extension regions 11, 12 is, for example, 30 nm.

Figure 3:
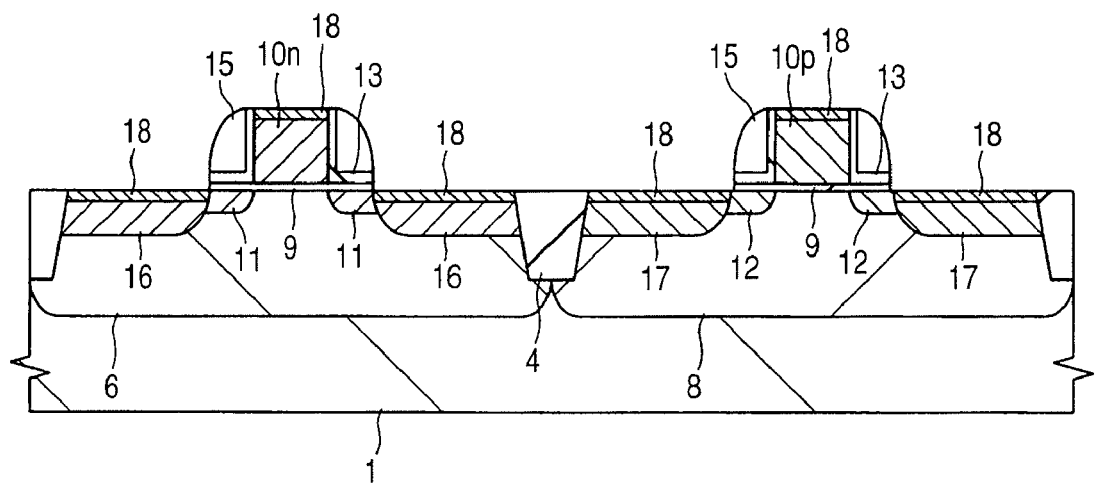
FIG. 3 is a cross-sectional view of relevant parts at the same place as FIG. 1 during a manufacturing step of the CMOS device, continued from FIG. 2.

Next, as shown in FIG. 3, after a silicon oxide film 13 having, for example, a thickness of 10 nm is deposited over the principal surface of semiconductor substrate 1 by the CVD method, a silicon nitride film is further deposited over the silicon oxide film 13 by the CVD method. Subsequently, the silicon nitride film is anisotropically etched by a RIE (Reactive Ion Etching) method to form a sidewall 15 at each sidewall of the gate electrode 10n of the nMIS and the gate electrode 10p of the pMIS. After that, an n-type impurity, for example, arsenic is ion implanted into the p-type well 6 to form a source/drain diffusion region 16 having relatively high concentration in a manner of self-alignment with respect to the gate electrode 10n of the nMIS and the side wall 15. Similarly, an p-type impurity, for example, boron fluoride is ion implanted into the n-type well 8 to form a source/drain diffusion region 17 having relatively high concentration in manner of self alignment with respect to the gate electrode 10p of the pMIS and the sidewall 15. The depth of the source/drain diffusion regions 16, 17 is, for example, 50 nm.

Next, a low-resistance nickel silicide (NiSi) layer 18 is formed over the surface of the gate electrode 10n of the nMIS and the source/drain diffusion region 16 as well as over the surface of the gate electrode 1op of the pMIS and the source/drain diffusion region 17 by using a salicide technology. Though the nickel silicide layer is exemplified in this case, it is also preferable to form other silicide layers, for example, a titanium silicide layer, a cobalt silicide layer or the like. The nickel silicide layer 18 is formed by a method, for example, explained below.

First, a nickel film and a titanium nitride film are sequentially deposited by a sputtering method over the principal substrate of the semiconductor substrate 1. The thickness of the nickel film is, for example, 10 nm and the thickness of the titanium nitride film is, for example, 15 nm. The titanium nitride film is provided over the nickel film for preventing oxidation of the nickel film, and a titanium film is also preferable to be used instead of the titanium nitride film. Subsequently, the nickel film is made to react with the n-type polycrystalline silicon film included in the gate electrode 10n of the nMIS as well as the nickel film is made to react with the single crystalline silicon included in the semiconductor substrate 1 in which the source/drain diffusion region 16 of the nMIS is formed selectively by performing heat treatment to the semiconductor substrate 1 at a temperature of 320° C. for 30 seconds using a RTA (Rapid Thermal Anneal) method to form the nickel silicide layer 18. Similarly, the nickel film is made to react with the p-type polycrystalline film included in the gate electrode 10p of the pMIS as well as the nickel film is made to react with the single crystalline silicon included in the semiconductor substrate 1 in which the source/drain region 17 of the pMIS is formed selectively to form the nickel silicide layer 18. Subsequently, after the nickel film and the titanium nitride film which are not reacted are removed by wet cleaning using sulfuric acid or a wet cleaning using sulfuric acid and hydrogen peroxide solution, the nickel silicide layer 18 is made to be low resistant by performing heat treatment, for example, at a temperature of 550° C. for 30 seconds to the semiconductor substrate 1 by using the RTA method.

Figure 4:
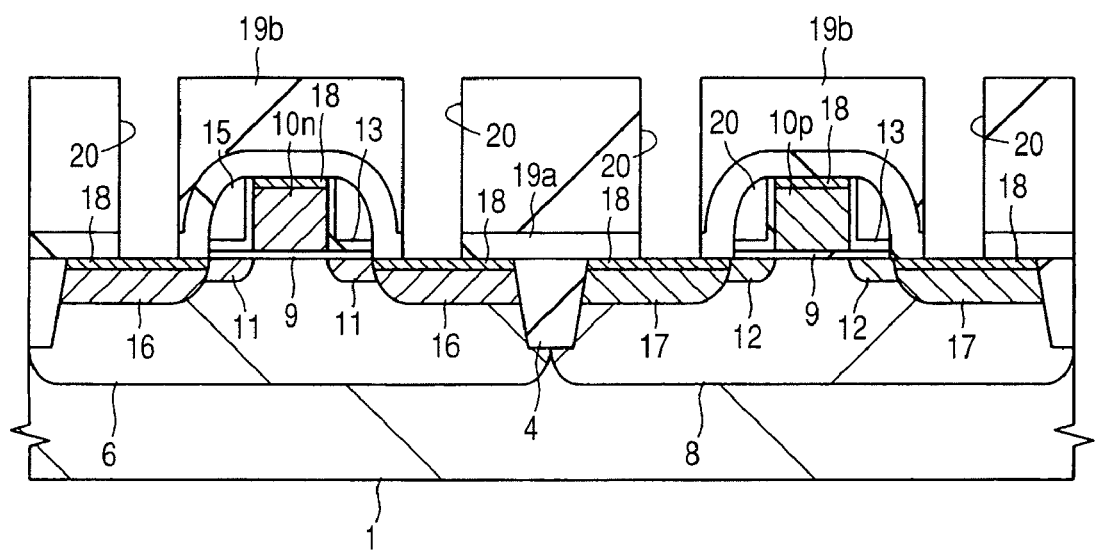
FIG. 4 is a cross-sectional view of relevant parts at the same place as FIG. 1 during a manufacturing step of the CMOS device, continued from FIG. 3.

Next, as shown in FIG. 4, a silicon nitride film is deposited over the principal surface of the semiconductor substrate 1 by the CVD method to form a first insulating film 19a. Subsequently, a TEOS (Tetra Ethyl Ortho Silicate) film is deposited over the first insulating film 19a by a plasma CVD method to form a second insulating film 19b, as a result, an interlayer insulating film including the first and second insulating films 19a, 19b is formed. After that, the surface of the second insulating film 19b is polished by the CMP method. Even when a rugged shape is formed at the surface of the first insulating film 19a caused by level differences of the base, the surface of the second insulating film 19b is polished by the CMP method, thereby obtaining the interlayer insulating film whose surface is planarized.

Next, the first and second insulating films 19a, 19b are etched, using a resist pattern as a mask to form connection holes 20 at predetermined points, for example, in the first and second insulating films 19a, 19b positioned above the gate electrode 10n of the nMIS and the source/drain diffusion layer 16, as well as the gate electrode 10p of the pMIS and the source/drain diffusion region 17. An aperture of the connection holes 20 is 0.1 μm or less, for example 0.08 μm.

Figure 5A:
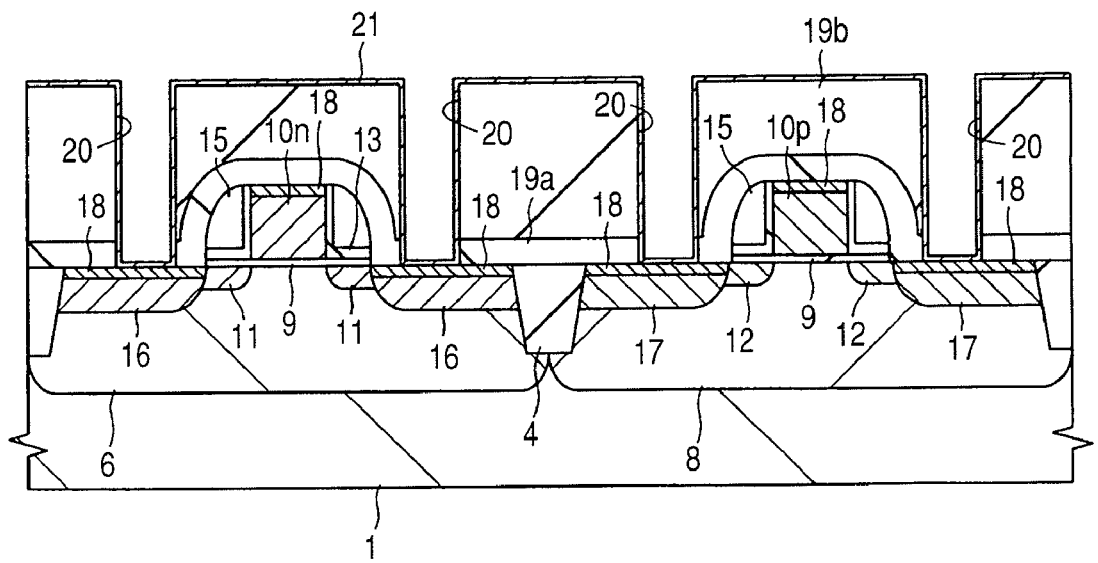
FIG. 5A is a cross-sectional view of relevant parts at the same place as FIG. 1 during a manufacturing step of the CMOS device, continued from FIG. 4.
Figure 5B:
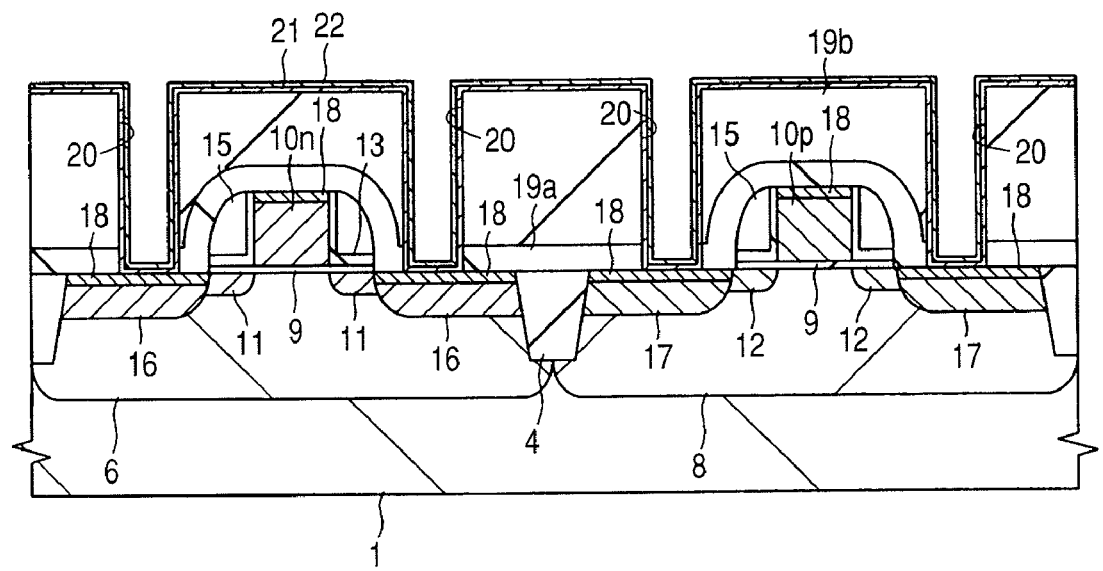
FIG. 5B is a cross-sectional view of relevant parts at the same place as FIG. 1 during a manufacturing step of the CMOS device, continued from FIG. 5A.

Next, as shown in FIG. 5A, a titanium film 21 is deposited over the principal surface of the semiconductor substrate 1 including the insides of the connection holes 20, and further, as shown in FIG. 5B, a titanium nitride film 22 is deposited over the titanium film 21. The titanium film 21 can solve oxygen atoms to 25 at %, therefore, it is used as a reducing agent at the surface of the nickel silicide layer 18, having a function of reducing contact resistance with respect to the nickel silicide layer 18. The titanium nitride film 22 has a function of suppressing or preventing diffusion of component atoms of a metal film embedded into the connection holes 20 in the later process. In the following explanation, a stacked film in which the titanium nitride film 22 is stacked over the titanium film 21 is called as a barrier-metal film, which is distinguished from a metal film to be a main conductive material being embedded into the connection holes 20.

A deposition system 50 shown in FIG. 6 is used for deposition of the titanium film 21 and the titanium nitride film 22. Hereinafter, a method of forming the titanium film 21 and the titanium nitride film 22 will be explained in detail with reference to FIG. 6 to FIGS. 9A, 9B and 9C.

The deposition system 50 is a multi-chamber type apparatus in which two transfer chambers of a first transfer chamber 51a and a second transfer chamber 51b are arranged, a loader 53, an unloader 54, and three chambers 55, 56 and 57 are provided around the first transfer chamber 51a through gate valves 52 as opening/closing means, and two chambers 58, 59 are provided around the second transfer chamfer 51b through gate valves 52 as opening/closing means. And further, two transfer chambers 60, 61 are provided between the first transfer chamber 51a and the second transfer chamber 51b. The first transfer chamber 51a is maintained under vacuum in the predetermined degree by an exhaust mechanism and the like, in which a transfer robot 62a having an articulated arm for transferring a semiconductor wafer SW is provided at the center thereof. Similarly, the second transfer chamber 51b is maintained under vacuum in the predetermined degree by the exhaust mechanism and the like, in which a transfer robot 62b having the articulated arm for transferring the semiconductor wafer SW is provided at the center thereof.

The chambers 55, 56 provided at the first transfer chamber 51a are chambers for heat treatment which perform heat treatment at a high temperature, for example, at 150° C. or more, and the chamber 57 is a chamber for dry cleaning treatment. The chamber 58 provided at the second transfer chamber 51b is a titanium deposition chamber which deposits the titanium film 21 by a high-directivity sputtering method or the plasma CVD method, and the chamber 59 is a titanium nitride deposition chamber which deposits the titanium nitride film 22 by a MOCVD (Metal Organic Chemical Vapor Deposition) method or the plasma CVD method. The chambers 60, 61 provided between the first transfer chamber 51a and the second transfer chamber 51b are delivery chambers which deliver the semiconductor wafer SW between the first transfer chamber 51a and the second transfer chamber 51b, which are cooling chambers also used for cooling the semiconductor wafer SW. In the deposition system 50, chambers provided only at the first transfer chamber 51a are three and chambers provided only at the second transfer chamber 51b are two, however, it is not limited to this and it is possible to add chambers for the same application or for other applications.

First, a FOUP (Front Open Unified Pod) in which a plurality of semiconductor wafers SW are loaded is put over the loader 53 (Step P1 in FIG. 7), then, apiece of semiconductor wafer SW is picked up from the FOUP by the transfer robot 62a and is vacuum transferred to the first transfer chamber 51a. The FOUP is an airtight container for batch transfer of the semiconductor wafers SW, which usually contains the semiconductor wafers in a batch unit such as 25 pieces, 12 pieces, 6 pieces or the like. Since a container outer wall of the FOUP has an airtight structure except a minute ventilation filter portion, dust is rejected almost completely. Therefore, even when transferred in class 1000 atmosphere, cleanliness of class 1 can be kept at the inside of the container. The docking with the deposition system 50 is performed in a state in which the cleanliness is kept by drawing a door of the FOUP into the deposition system 50.

Next, the semiconductor wafer SW is vacuum transferred from the first transfer chamber 51a to the chamber 57 for dry cleaning treatment by the transfer robot 62a (Step P2 in FIG. 7). A schematic cross-sectional view of the chamber 57 is shown in FIG. 8. The chamber 57 chiefly includes a wafer stage 57a, wafer lift pins 57b, a showerhead 57c and a remote plasma generating apparatus 57d. The wafer stage 57a and the wafer lift pins 57b respectively have independent lifting and lowering mechanisms, thereby arbitrarily controlling the distance between the showerhead 57c and the semiconductor wafer SW and the distance between the semiconductor wafer SW and the wafer stage 57a. The showerhead 57c provided above the wafer stage 57a is constantly maintained at a fixed temperature, which is, for example, 180° C.

Figure 9A:
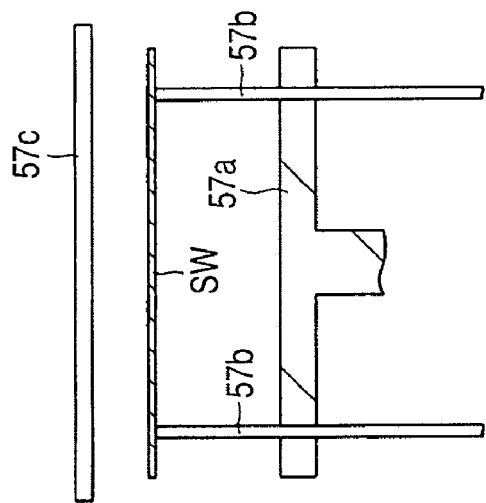
FIGS. 9A, 9B and 9C are respectively schematic cross-sectional views of the chamber for explaining processing steps of a semiconductor wafer in the chamber for dry cleaning treatment provided in the barrier metal film deposition system according to the first embodiment of the invention.
Figure 10:
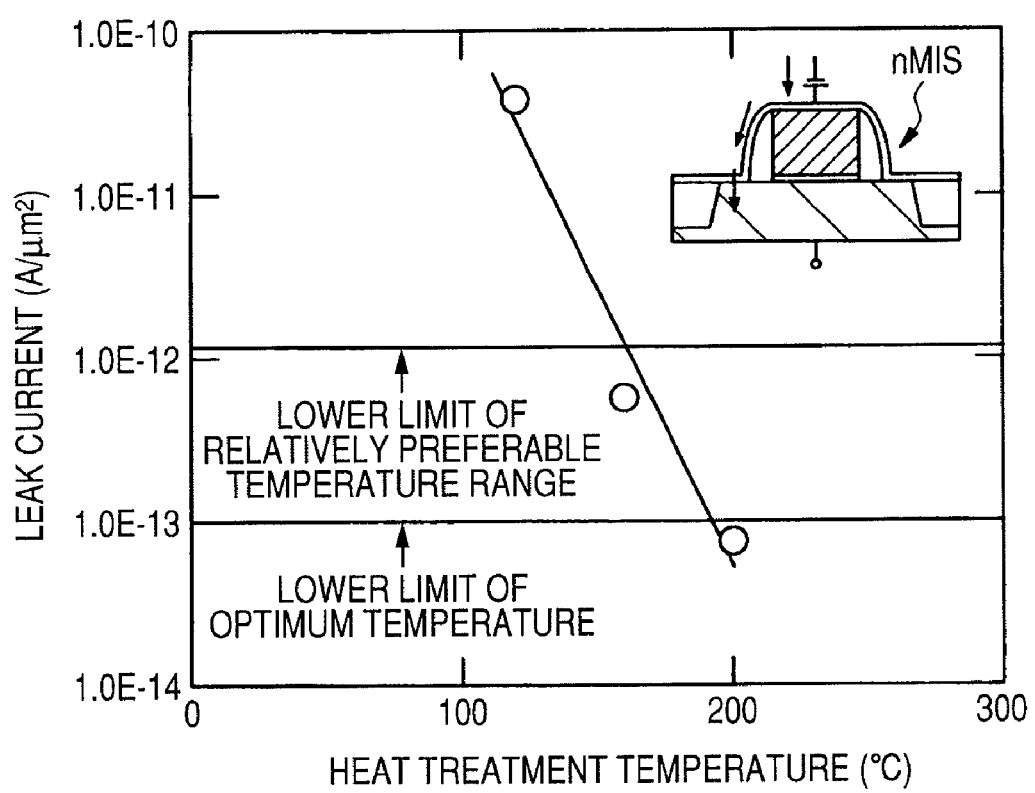
FIG. 10 is a graph showing the relation between electric current flowing in a gate electrode and a semiconductor substrate, and the heat treatment temperature in the case that dry cleaning treatment and heat treatment are performed to the semiconductor substrate after forming an nMIS.

When the semiconductor wafer SW is transferred to the chamber 57, as shown in FIG. 9A, the wafer stage 57a is lowered and the wafer lift pins 57b are lifted to put the semiconductor wafer SW over the wafer lift pins 57b. The distance between the showerhead 57c and the semiconductor wafer SW is set to, for example, 16.5±12.7 mm, and the distance between the semiconductor wafer SW and the wafer stage 57a is set to, for example, 25.4±17.8 mm.

Figure 9B:
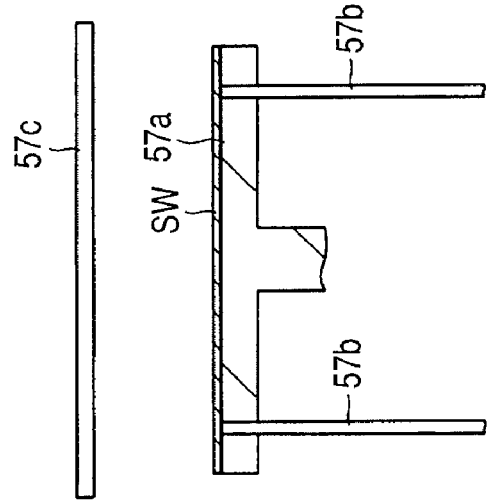

Subsequently, when performing dry cleaning treatment to the principal surface of the semiconductor wafer SW, as shown in FIG. 9B, the wafer stage 57a is lifted, and the wafer lift pins 57b are lowered to put the semiconductor wafer SW over the wafer stage 57a. The distance between the showerhead 57c and the semiconductor wafer SW is set to, for example, 17.8±5.1 mm.

At the time of dry cleaning treatment, reducing gas such as Ar gas to which $NF_3$ gas and $NH_3$ gas are added, or Ar gas to which $NF_3$ gas and $H_2$ gas are added is excited in the remote plasma generating apparatus 57d to generate plasma, which is introduced into the chamber 57. By supplying plasma introduced into the chamber 57 over the principal surface of the semiconductor wafer SW through the showerhead 57c, a natural oxide film is removed by reducing reaction shown by, for example, a formula (1), which occurs between plasma and the natural oxide film formed at the surface of the nickel silicide layer 18. Process conditions at the time of dry cleaning treatment are, for example, as follows. A showerhead temperature is 180° C., the flow rate of $NF_3$ gas is 14 sccm, the flow rate of the $NH_3$ gas is 70 sccm, pressure is 400 Pa and plasma power is 30 W.

$$SiO_2+NF_3+NH_3 \rightarrow (NH_4)_2SiF_6+O_2 \qquad \text{Formula (1)}$$

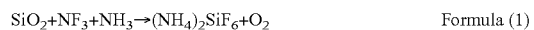

The product $((NH_4)_2SiF_6)$ generated by reducing reaction at this time remains over the principal surface of the semiconductor wafer SW including the insides of connection holes 20. And further, since the semiconductor wafer SW is just put over the wafer stage 57a, the product remains also in parts of the side surface and the rear surface of the semiconductor wafer SW. The product remaining in parts of the side surface and the rear surface of the semiconductor wafer SW peels off when the semiconductor wafer SW is transferred to another chamber and other occasions, which causes occurrence of dirt or dust. Consequently, heat treatment is performed to the semiconductor wafer SW in the chamber 57, continued from the dry cleaning treatment, thereby removing the product remaining over the principal surface of the semiconductor wafer SW as well as removing the product remaining in parts of the side surface and rear surface of the semiconductor wafer SW.

Figure 9C:
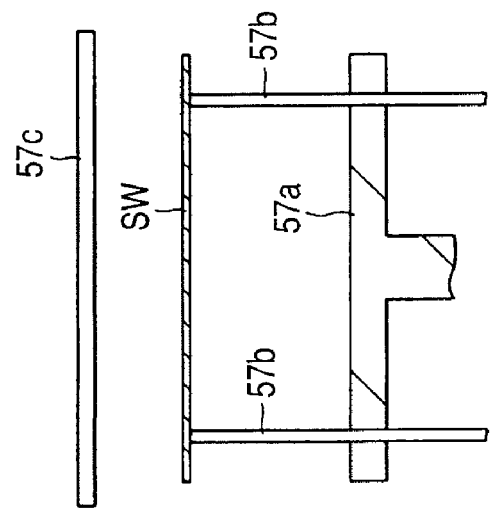

Subsequently, when heat treatment is performed to the semiconductor wafer SW, as shown in FIG. 9C, the wafer stage 57a is lowered, an the wafer lift pins 57b are lifted to make the semiconductor wafer SW close to the showerhead 57c which is set at a temperature of 180° C. The distance between the showerhead 57c and the semiconductor wafer SW is set to, for example, 3.8±2.6 mm, and the distance between the semiconductor wafer SW and the wafer stage 57a is set to, for example, 5.9 mm or more.

At the time of heat treatment, the semiconductor wafer SW is heated by using the heating temperature (180° C.) of the showerhead 57c. The temperature of the semiconductor wafer SW increases from 100 to 150° C., and the product $((NH_4)_2SiF_6)$ formed over the principal surface of the semiconductor wafer SW at the time of dry cleaning treatment is sublimed and removed by the reaction, for example, shown in a formula (2). And further, since the side surface and the rear surface of the semiconductor wafer SW are also heated by the heat treatment, the product remaining in parts of the side surface and the rear surface is also removed.

$(NH_4)_2SiF_6 \rightarrow SiF_4 + 2NH_3 + 2HF$  Formula (2)

However, when the composition of the product formed on the semiconductor wafer SW at the time of dry cleaning treatment is different from $(NH_4)_2SiF_6$ even slightly, the reaction of the formula (2) hardly occurs in the heat treatment at the temperature of 100 to 150° C., and it is difficult to remove the product completely, as a result, extremely minute product remains over the principal surface of the semiconductor wafer SW. As described above, when the product remains inside the connection holes 20 even slightly, problems such as variations of contact resistance in the titanium film 21 and the nickel silicide layer 18 formed inside the connection holes 20 occur. Consequently, in the next step, heat treatment at a temperature higher than 150° C. is performed to the semiconductor wafer SW, thereby removing the minute product remaining over the principal surface of the semiconductor wafer SW.

Next, the semiconductor wafer SW is vacuum transferred from the chamber 57 for dry cleaning treatment to the chamber 55 (or the chamber 56) for heat treatment through the first transfer chamber 51a by the transfer robot 62a to be put over a stage provided in the chamber 55 (or the chamber 56) (Step P3 in FIG. 7). By putting the semiconductor wafer SW on the stage of the chamber 55 (or the chamber 56), the semiconductor wafer SW is heated at a predetermined temperature to sublime and remove the product remaining on the principal surface of the semiconductor wafer SW which has not been sublimed at the temperature of 100 to 150° C. The temperature at the principal surface of the semiconductor wafer SW is considered to be, for example, 150 to 400° C. as an appropriate range (it goes without saying that it is not limited to the range according to other conditions). It is considered that a range suitable for mass production is 165 to 350° C., particularly, it is considered that a range in which 200° C. is taken as the center value, for example, 180 to 220° C. is most preferable.

FIG. 10 is a graph showing the relation of electric current (leak current) which flows between the gate electrode and the semiconductor substrate, and the heat treatment temperature when dry cleaning treatment and heat treatment are performed to the semiconductor substrate after forming the nMIS (inset drawing in FIG. 10).

Gate current of a normal nMIS is approximately $1\times10^{-13}$ A/$\mu m^2$, however, when the product generated by dry cleaning treatment remains at the surface of the nMIS, surface leak current of $5\times10^{-11}$ A/$\mu m^2$ or more flows through the product. However, when heat treatment is performed at a temperature higher than 150° C., surface leak current is reduced according to the increase of temperature. For example, when heat treatment is performed at a temperature of approximately 160° C., leak current is reduced to approximately $1\times10^{-12}$ A/$\mu m^2$, further, when heat treatment is performed at a temperature of approximately 180° C., leak current is reduced to approximately $1\times10^{-13}$ A/$\mu m^2$. According to the results, it is considered that the product can be removed to be a state in which leak current does not flow at the surface of the nMIS by performing heat treatment at the temperature higher than 180° C.

Next, the semiconductor wafer SW is vacuum transferred from the chamber 55 (or the chamber 56) for heat treatment to the chamber 60 (or the chamber 61) for cooling/delivery through the first transfer chamber 51a by the transfer robot 62a to be put over a stage provided in the chamber 60 (or the chamber 61) (Step S4 in FIG. 7). By putting the semiconductor wafer SW over the stage of the chamber 60 (or the chamber 61), the semiconductor wafer SW is cooled.

Next, the semiconductor wafer SW is vacuum transferred from the chamber 60 (or the chamber 61) for cooling/delivery to the chamber 58 for titanium deposition through the second transfer chamber 51b by the transfer robot 62b (Step P5 in FIG. 7). A predetermined degree of vacuum is set inside the chamber 58 by the exhaust mechanism, for example, $1.33\times10^{-6}$ Pa, then, the semiconductor wafer SW is heated to a predetermined temperature, and Ar gas is introduced into the chamber 58 by a predetermined flow rate to deposit the titanium film 21 over the principal surface of the semiconductor wafer SW by the high-directivity sputtering method. The thickness of the titanium film 21 is, for example, 20 nm. The titanium film 21 can be deposited by the plasma CVD method, in addition to the high-directivity sputtering method.

Next, the semiconductor wafer SW is vacuum transferred from the chamber 58 for titanium deposition to the chamber 59 for titanium nitride deposition through the second transfer chamber 51b by the transfer robot 62b (Step P6 in FIG. 7). After a predetermined degree of vacuum is set inside the chamber 59 by the exhaust mechanism, the semiconductor wafer SW is heated to a predetermined temperature, and a predetermined gas is introduced into the chamber 59 by a predetermined flow rate to deposit the titanium nitride film 22 over the principal surface of the semiconductor wafer SW by the MOCVD method or the plasma CVD method. The thickness of the titanium nitride film 22 is, for example, 5 nm.

Next, the semiconductor wafer SW is vacuum transferred from the chamber 59 for titanium nitride deposition to the chamber 60 (or the chamber 61) for cooling/delivery through the second transfer chamber 51b by the transfer robot 62b (Step P7 in FIG. 7).

Next, the semiconductor wafer SW is vacuum transferred from the chamber 60 (or the chamber 61) for cooling/delivery to the unloader 54 by the transfer robot 62a (Step P8 in FIG. 7) to be put over the FOUP placed in the unloader 54.

Accordingly, the product generated at the bottoms and the side surfaces of the connection holes 20 at the time of dry cleaning is removed by performing heat treatment at 150 to 400° C. to the semiconductor substrate 1 (Step P3 in FIG. 7) between the step of dry cleaning treatment (Step P2 in FIG. 7) and the step of depositing the titanium film 21 (Step P5 in FIG. 7), therefore, it is possible to reduce variations of contact resistance between the titanium film 21 at the bottoms of the connection holes 20 and the nickel silicide layer 18. Further, it can be prevented that the titanium film 21 is peeled at the side surfaces of the connection holes 20.

Figure 11:
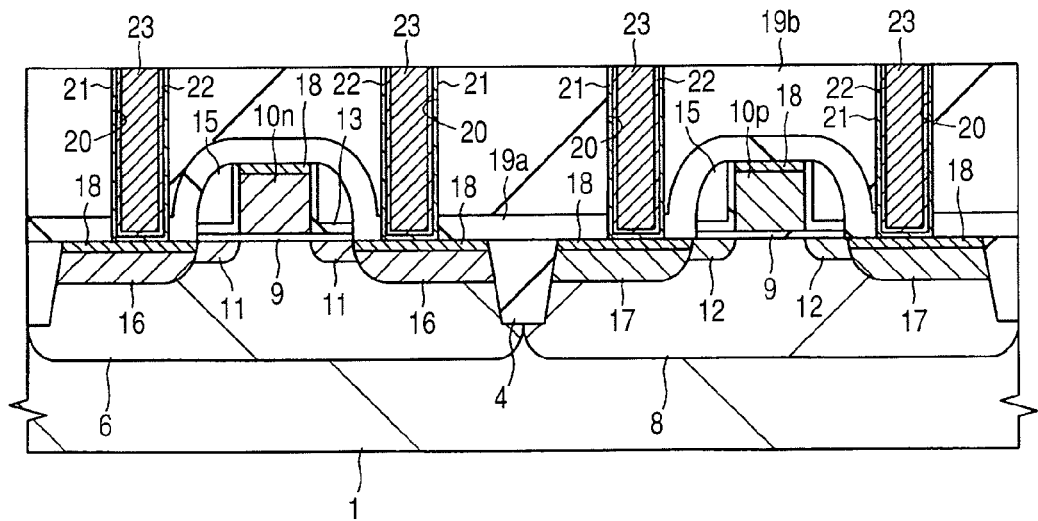
FIG. 11 is a cross-sectional view of relevant parts at the same place as FIG. 1 during a manufacturing step of the CMOS device, continued from FIG. 5.

After that, as shown in FIG. 11, a tungsten film 23 is deposited over the principal surface of the semiconductor substrate 1 including the insides of the connection holes 20 by the CVD method, and the surface of the tungsten film 23 is planarized by, for example, the CMP method to embed the tungsten film 23 inside the connection holes 20, consequently, plugs having the tungsten film 23 as main conductive material are formed.

In the above process of forming the plugs inside the connection holes 20, the main conductive material of the plugs is the tungsten film 23, and the barrier metal film is a stacked film in which the titanium nitride film 22 is stacked over the titanium film 21, however, it is not limited to this but it is possible to variously change the configuration. For example, (1) the main conductive material of the plugs is the tungsten film and the barrier metal film is a tungsten nitride film. Since the tungsten nitride film and the tungsten film are sequentially formed by one tungsten deposition system, throughput is improved and the cost can be reduced. (2) The main conductive material of the plugs is a copper film and the barrier metal film is the titanium nitride film. (3) The main conductive material of the plugs is the copper film and the barrier metal film is a tantalum nitride film. By using the tantalum nitride film, copper atoms can be suppressed or prevented from being diffused as compared with the case in which the titanium nitride film is used for the barrier metal film. (4) The main conductive material of the plugs is the copper film and the barrier metal film is a stacked film in which a tantalum film is stacked over the tantalum nitride film. By inserting the tantalum film between the copper film and the tantalum nitride film, the adhesiveness of the copper film and the tantalum nitride film can be improved. (5) The main conductive material of the plugs is the copper film and the barrier metal film is a stacked film in which a ruthenium film is stacked over the tantalum nitride film. By inserting the ruthenium film between the copper film and the tantalum nitride film, the adhesiveness of the copper film and the tantalum nitride film can be improved. (6) The main conductive material of the plugs is an aluminum film and the material of the barrier metal film is a stacked film in which the titanium nitride film is stacked over the titanium film, or tungsten nitride film.

Figure 12:
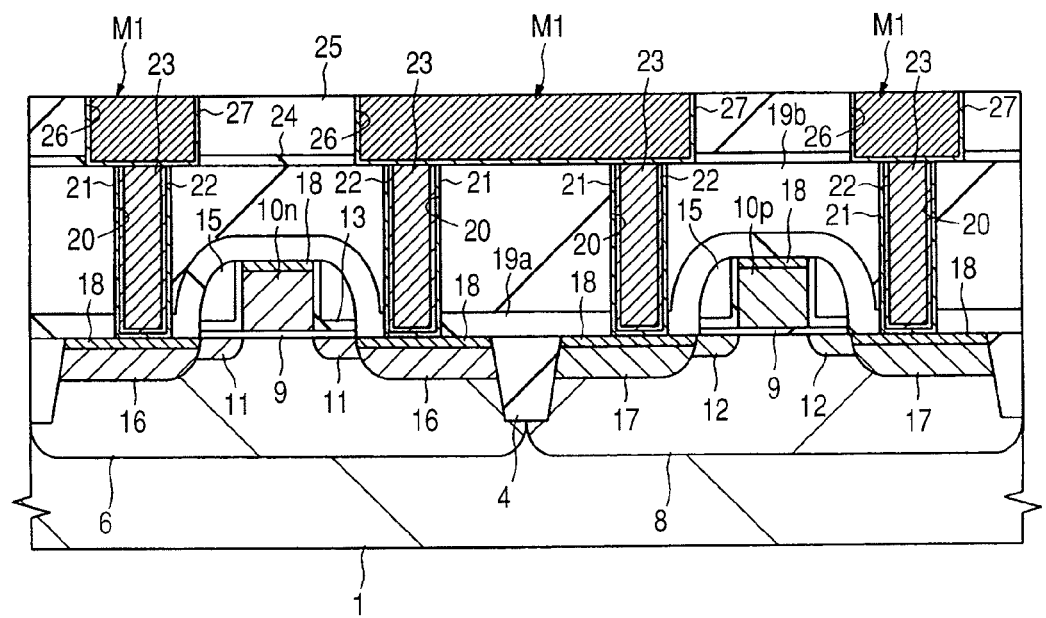
FIG. 12 is a cross-sectional view of relevant parts at the same place as FIG. 1 during a manufacturing step of the CMOS device, continued from FIG. 11.

Next, as shown in FIG. 12, a stopper insulating film 24 and an insulating film 25 for forming wiring are sequentially formed over the principal surface of the semiconductor substrate 1. The stopper insulating film 24 is a film to be an etching stopper when processing trenches in the insulating film 25, in which a material having the etching selection ratio with respect to the insulating film 25 is used. The stopper insulating film 24 may be, for example, a silicon nitride film formed by the plasma CVD method, and the insulating film 25 may be, for example, a silicon oxide film formed by the plasma CVD method. In the stopper insulating film 24 and the insulating film 25, a wiring of the first layer described below is formed.

Next, a wiring of the first layer is formed by a single damascene method. After wiring trenches 26 are formed at predetermined regions in the stopper insulating film 24 and the insulating film 25 by dry etching, using a resist pattern as a mask, a barrier metal film 27 is formed over the principal surface of the semiconductor substrate 1. The barrier metal film 27 is, for example, the titanium nitride film, the tantalum nitride film, the stacked film in which the tantalum film is stacked over the tantalum nitride film or the stacked film in which the ruthenium film is stacked over the tantalum nitride film. Subsequently, a copper seed layer is formed over the barrier metal layer 27 by the CVD method or the sputtering method, further, a copper plating film is formed over the seed layer by using an electrolytic plating method. The insides of the wiring trenches 26 are embedded by the copper plating film. Subsequently, the copper plating film, the seed layer and the barrier metal film 27 at regions excluding the wiring trenches 26 are removed by the CMP method to form wring M1 of the first layer whose main conductive material is the copper film.

Figure 13:
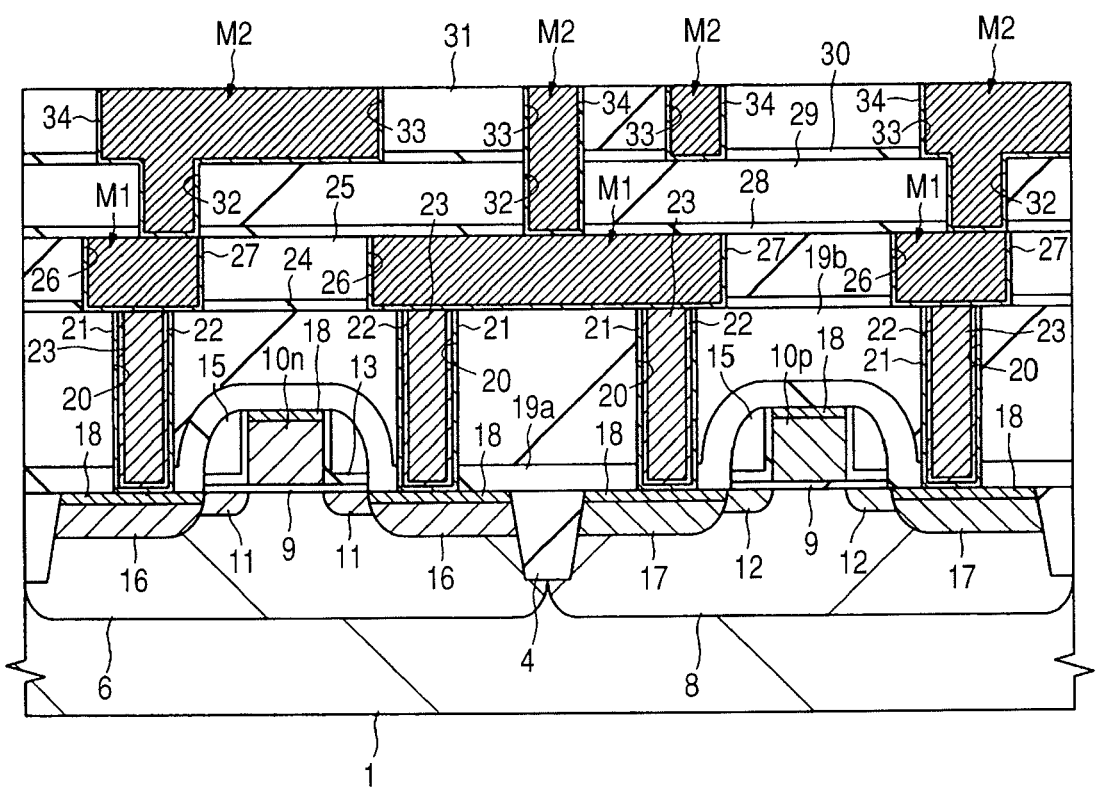
FIG. 13 is a cross-sectional view of relevant parts at the same place as FIG. 1 during a manufacturing step of the CMOS device, continued from FIG. 12.

Next, a wiring of the second layer is formed by a dual damascene method. First, as shown in FIG. 13, a cap insulating film 28, an interlayer insulating film 29 and a stopper insulating film 30 for forming the wiring are sequentially formed over the principal surface of the semiconductor substrate 1. Connection holes are formed in the cap insulating film 28 and the interlayer insulating film 29 as described later. The cap insulating film 28 includes a material having the etching selection ratio with respect to the interlayer insulating film 29, which may be, for example, the silicon nitride film formed by the plasma CVD method. And further, the cap insulating film 28 has a function as a protective film preventing diffusion of copper included in the wiring M1 of the first layer. The interlayer insulating film 29 may be, for example, a TEOS film by the plasma CVD method. The stopper insulating film 30 includes an insulating material having the etching selection ratio with respect to an insulating film for forming the wiring to be deposited over the interlayer insulating film 29 and, over the stopper insulating film 30 in a later step, which may be, for example, the silicon nitride film formed by the plasma CVD method.

Next, after the stopper insulating film 30 is processed by dry etching, using a resist patter for forming holes as a mask, an insulating film 31 for forming the wiring is formed over the stopper insulating film 30. The insulating film 31 may be, for example, a TEOS film.

Next, the insulating film 31 is processed by dry etching, using a resist pattern for forming wiring trenches as a mask. At this time, the stopper insulating film 30 functions as an etching stopper. Subsequently, the interlayer insulating film 29 is processed by dry etching, using the stopper insulating film 30 and resist pattern for forming wiring trenches as masks. At this time, the cap insulating film 28 functions as the etching stopper. Subsequently, by removing the exposed cap insulating film 28 by dry etching, connection holes 32 are formed in the cap insulating film 28 and the interlayer insulating film 29, and wiring trenches 33 are formed in the stopper insulating film 30 and the insulating film 31.

Next, a wiring of the second layer is formed inside the connection holes 32 and the wiring trenches 33. The wiring of the second layer is formed by the barrier metal layer and the copper film which is the main conductive material, and connection members which connect the wiring to the wiring M1 of the first layer which is the wiring of the lower layer are formed integrally with the wiring of the second layer. First, a barrier metal film 34 is formed over the principal surface of the semiconductor substrate 1 including the insides of the connection holes 32 and the wiring trenches 33. The barrier metal film 34 is, for example, the titanium nitride film, the tantalum nitride film, the stacked film in which the tantalum film is stacked over the tantalum nitride film, or the stacked film in which the ruthenium film is stacked over the tantalum nitride film. Before forming the barrier metal film 34, the above described dry cleaning treatment is performed, and in the dry cleaning treatment, it is preferable to perform, after that, the above described heating at the temperature of 100 to 150° C. and the heating at the temperature higher than 150° C. to the semiconductor wafer to remove the product generated at the bottom surface of the connection holes 32 and sidewalls of the connection holes 32 and the wiring trenches 33. Accordingly, it is possible to reduce variations of contact resistance between the barrier metal film 34 and the wiring M1 of the first layer as well as to prevent the barrier metal film 34 from being peeled off from the cap insulating film 28, the interlayer film 29, the stopper insulating film 30 and the insulating film 31. Subsequently, a copper seed film is formed over the barrier metal film 34 by the CVD method or the sputtering method, further, a copper plating film is formed over the seed layer using the electrolytic plating method. The insides of the connection holes 32 and the wiring trenches 33 are embedded by the copper plating film. Subsequently, the copper plating film, the seed layer and the barrier metal film 34 at regions excluding the connection holes 32 and the wiring trenches 33 are removed by the CMP method to form a wring M2 of the second layer whose main conductive material is the copper film.

Figure 14:
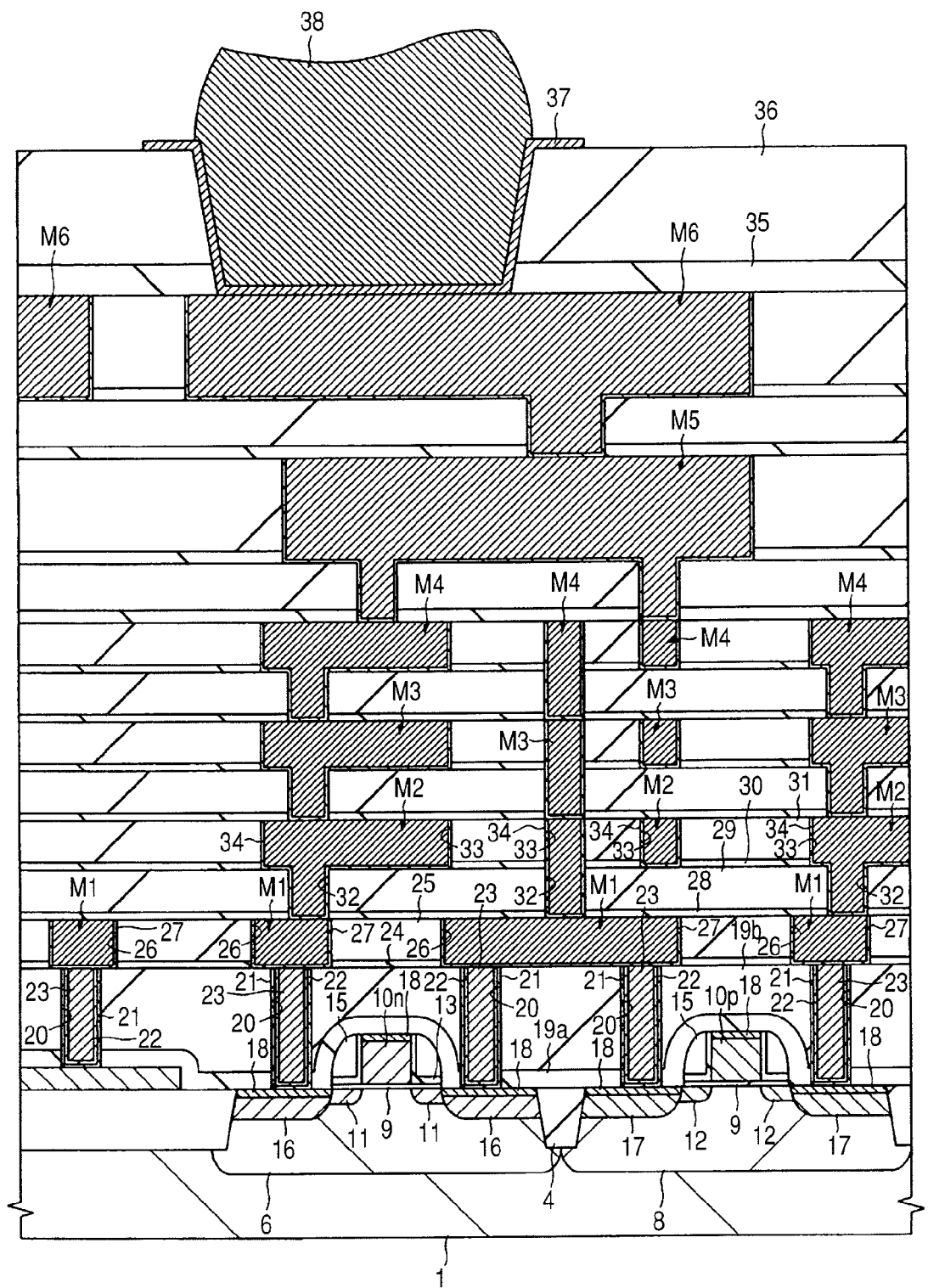
FIG. 14 is a cross-sectional view of relevant parts at the same place as FIG. 1 during a manufacturing step of the CMOS device, continued from FIG. 13.

After that, as shown in FIG. 14, wirings of further upper layers are formed by, for example, a method similar to the above wiring M2 of the second layer. In FIG. 14, a CMOS device in which wirings M3, M4, M5 and M6 of the third to sixth layers are formed is exemplified. Subsequently, a silicon nitride film 35 is formed over the wiring M6 of the sixth layer, and a silicon oxide film 36 is formed over the silicon nitride film 35. The silicon nitride film 35 and the silicon oxide film 36 function as a passivation film which prevents penetration of moisture or impurities from the outside and suppresses transmission of an alpha ray.

Next, the silicon nitride film 35 and the silicon oxide film 36 are processed by etching, using a resist patter as a mask to expose a portion (bonding pad portion) of the wiring M6 of the sixth layer. Subsequently, an under-bump electrode 37 formed by a stacked film such as a gold film and nickel film is formed over the exposed wiring M6 of the sixth layer, and a bump electrode 38 made of gold and solder or the like is formed over the under-bump electrode 37, thereby completing the CMOS device as the first embodiment. The bump electrode 38 will be an electrode for external connection. After that, the semiconductor wafer SW is cut into semiconductor chips individually and mounted on a package substrate and the like to complete a semiconductor device, through explanations of which are omitted.

In the dry cleaning treatment of the first embodiment, plasma is generated in the remote plasma generating apparatus 57d by exciting reducing gas, for example, Ar gas to which $NF_3$ gas and $NH_3$ gas are added (Ar gas is used for gas for exciting plasma in many cases, however, other rare gasses or mixed gas of these gasses are also preferable), and the plasma is introduced into the chamber 57 to remove the natural oxide film by the reducing reaction. It is also preferable that reducing gas such as HF gas and $NH_3$ gas, or $NF_3$ gas and $NH_3$ gas is introduced into the chamber 57 without using plasma to remove the natural oxide film by the reducing reaction.

There is not any problem to use a normal plasma apparatus, not limited to the remote plasma apparatus, if there is not any problem in other characteristics. The remote plasma has an advantage that it does not cause damage to the substrate.

When performing processing using plasma, it is preferable to use combinations of other gasses, not limited to the above combinations of gasses, if they generate radicals or reacting species of nitrogen, hydrogen and fluorine (including complex radicals of them), and if it is not inimical to the process. That is to say, it is preferable to appropriately use a mixed gas atmosphere including radical generating gas of nitrogen, hydrogen and fluorine (including mixed gas), a plasma excited gas and other added gasses.

In addition, reaction gasses such as reducing gas are not limited to the above and it is preferable to use gasses which generate reaction species reacting with the oxide film and vaporized at a relatively low temperature.

As described above, according to the first embodiment, in dry cleaning treatment performed before forming the barrier metal film (stacked film in which titanium nitride film 22 is stacked over the titanium film 21) inside the connection holes 20, the product which is slightly different from the stoichiometric composition remains at the bottom surfaces and the side surfaces of the connection holes 20, however, the product is removed by heat treatment at the temperature higher than 150° C., which is performed after the dry cleaning treatment, therefore, variations of contact resistance between the barrier metal film at the bottom surfaces of the connection holes 20 and the nickel silicide layer 18 can be reduced, as well as the peeling of the barrier metal film at the side surfaces of the connection holes 20 can be prevented, thereby reducing variations in electrical characteristics in potions of the connection holes 20. In addition, the invention can be applied to the connection hole portions which connect wirings of upper and lower layers, thereby obtaining the same advantages. For example, in a process of forming dual damascene wiring shown in the first embodiment, the invention is performed after the dry cleaning treatment performed before forming the barrier metal film 34 inside the connection holes 32 and the wiring trenches 33, thereby reducing variation in electrical characteristics in portions of the connection holes 32.

Second Embodiment

As explained in the first embodiment, in the dry cleaning treatment performed in the process of forming the barrier metal film, the product remains at the principal surface and parts of the side surface and the rear surface of the semiconductor wafer SW. Consequently, the product having a composition of $(NH_4)_2SiF_6$ is removed by heating the semiconductor wafer SW at a temperature of 100 to 150° C., using the showerhead 57c set to 180° C., which is provided in the chamber 57 for dry cleaning treatment, further, the product of a composition which is slightly different from $(NH_4)_2SiF_6$ is removed by heating the semiconductor wafer SW at the temperature higher than 150° C. by the chambers 55, 56 for heating treatment.

In a second embodiment of the invention, the temperature of a showerhead 57CH provided in the chamber 57 for dry cleaning treatment is set to a temperature higher than 180° C., for example, at 250° C., and the semiconductor wafer SW is heated at a temperature at 180 to 220° C. by the showerhead 57CH just after the dry cleaning treatment to remove the product having the composition of $(NH_4)_2SiF_6$ and the product whose composition is slightly different from $(NH_4)_2SiF_6$.

Figure 15:
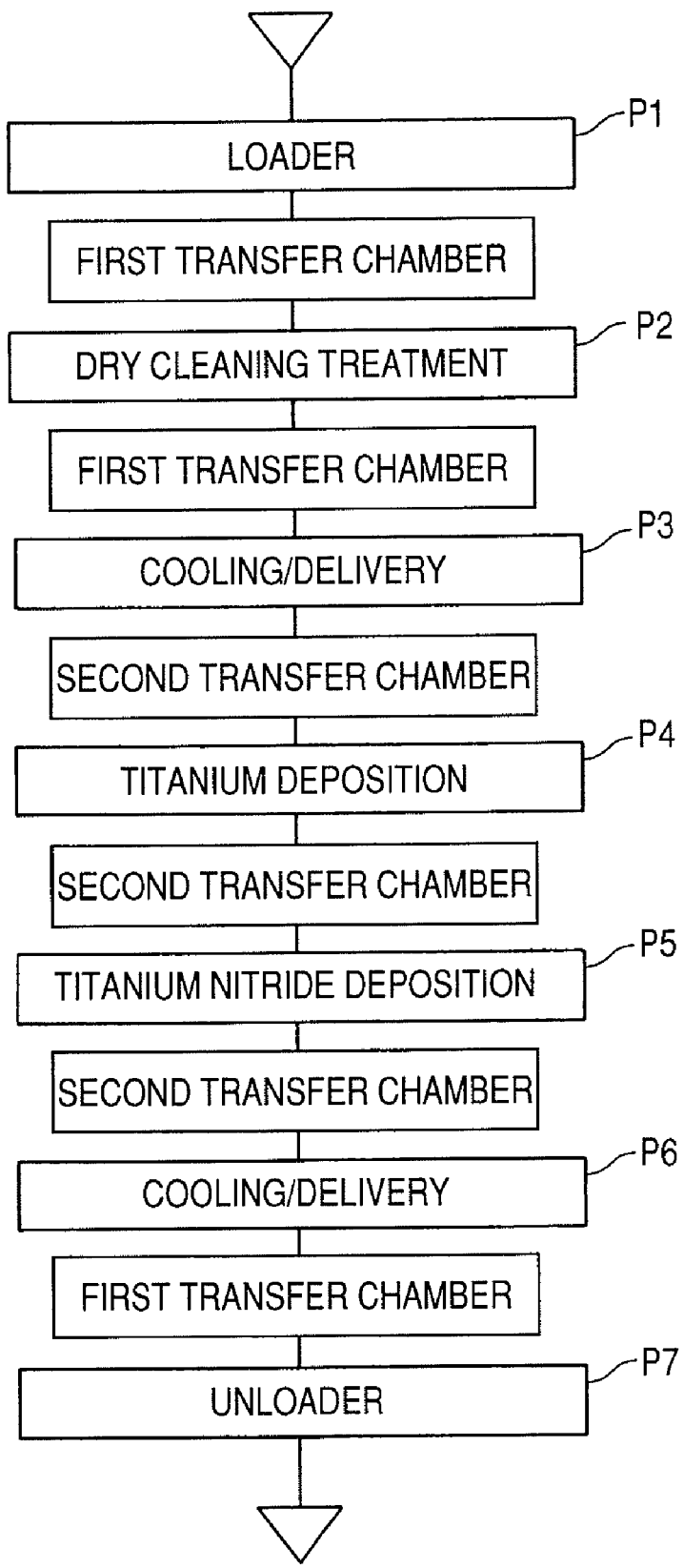
FIG. 15 is a chart of deposition steps of the barrier metal film according to a second embodiment of the invention.

A method of forming a barrier metal film according to the second embodiment will be explained with reference to FIG. 15, FIG. 16A to 16C. FIG. 15 is a chart of deposition steps of the barrier metal film, FIGS. 16A, 16B and 16C are schematic cross-sectional views of a chamber for respectively explaining processing steps of the semiconductor wafer in a chamber for dry cleaning treatment provided in a deposition system of the barrier metal film. As the deposition system of the barrier metal film, the deposition system 50 in the first embodiment is used.

First, in the same manner as the first embodiment, the semiconductor wafer SW is vacuum transferred from the loader 53 to the chamber 57 for dry cleaning treatment (Steps P1, P2 in FIG. 15). The showerhead 57CH provided in the chamber 57 is maintained at a constant temperature, and the temperature is, for example, 250° C.

When the semiconductor wafer SW is transferred to the chamber 57, as shown in FIG. 16A, the wafer stage 57a is lowered and the wafer lift pins 57b are lifted to put the semiconductor wafer SW over the wafer lift pins 57b. The distance between the showerhead 57CH and the semiconductor wafer SW is set to, for example, 16.5±12.7 mm, and the difference between the semiconductor wafer SW and the wafer stage 57a is set to, for example, 25.4±17.8 mm.

Subsequently, when performing dry cleaning treatment to the principal surface of the semiconductor wafer SW, as shown in FIG. 16B, the wafer stage 57a is lifted, and the wafer lift pins 57b are lowered to put the semiconductor wafer SW over the wafer stage 57a. The distance between the showerhead 57CH and the semiconductor wafer SW is set to, for example, 17.8±5.1 mm. The product $((NH_4)_2SiF_6)$ generated by reducing reaction remains at the principal surface and at parts of the side surface and the rear surface of the semiconductor wafer SW to which the dry cleaning treatment has been performed.

Subsequently, when heat treatment is performed to the semiconductor wafer SW, as shown in FIG. 16C, the wafer stage 57a is lowered, and the wafer lift pins 57b are lifted to make the semiconductor wafer SW close to the showerhead 57CH which is set to a temperature of 250° C. The distance between the showerhead 57CH and the semiconductor wafer SW is set to, for example, 3.8±2.6 mm, and the distance between the semiconductor wafer SW and the wafer stage 57a is set to, for example, 5.9 mm or more.

At the time of heating treatment, since the semiconductor wafer SW is heated by utilizing the heating temperature (250° C.) of the showerhead 57CH, the temperature of the semiconductor wafer SW becomes higher than 150° C., the product having the composition of $(NH_4)_2SiF_6$ remaining over the principal surface and parts of the side surface and the rear surface of the semiconductor wafer SW is removed at the time of dry cleaning treatment, further, the product whose composition is slightly different from $(NH_4)_2SiF_6$ is also removed.

Next, the semiconductor wafer SW is vacuum transferred from the chamber 57 for dry cleaning treatment to the chamber 60 (or the chamber 61) for cooling/delivery through the first transfer chamber 51a by the transfer robot 62a to be put over the stage provided in the chamber 60 (or the chamber 61) (Step P3 in FIG. 15). By putting the semiconductor wafer SW over the stage of the chamber 60 (or the chamber 61), the semiconductor wafer SW is cooled.

After that, in the same manner as the first embodiment, the titanium film is deposited in the chamber 58 for titanium deposition by the transfer robot 62b (Step P4 in FIG. 15) and the titanium nitride film is deposited over the titanium film in the chamber 59 for titanium nitride deposition (Step P5 in FIG. 15), then, the semiconductor wafer SW is vacuum transferred to the chamber 60 (or the chamber 61) for cooling/delivery (Step P6 in FIG. 15). Further, the semiconductor wafer SW is vacuum transferred to the unloader 54 by the transfer robot 62a (Step P7 in FIG. 15) to be put over the FOUP placed at the unloader 54.

As described above, according to the second embodiment, the unnecessary product generated at parts of the side surface and the rear surface of the semiconductor wafer SW in the dry cleaning treatment is removed by heat treatment at 180 to 220° C. by the showerhead 57CH, which is continued from the dry cleaning processing, therefore, the step of heating treatment in the chambers 55, 56 for heating treatment performed in the first embodiment becomes unnecessary, as a result, the number of manufacturing steps can be reduced as compared with the first embodiment.

Third Embodiment

As described in the embodiment, in the dry cleaning treatment performed in the step of forming the barrier metal film, the semiconductor wafer SW is merely put over the wafer stage 57a in general, therefore, the product having the composition of $(NH_4)_2SiF_6$ remains not only at the principal surface of the semiconductor wafer SW but also at parts of the side surface and the rear surface of the semiconductor wafer SW. The product remaining at parts of the side surface and the rear surface of the semiconductor wafer SW peels off when the semiconductor wafer SW is transferred to another chamber and other occasions, which causes dirt or dust. Consequently, in the first and second embodiments, heat treatment is performed to the semiconductor wafer SW in the same chamber 57, continued from the dry cleaning treatment, thereby removing the product remaining at the principal surface of the semiconductor wafer SW as well as the product remaining at parts of the side surface and the rear surface of the semiconductor wafer SW.

In a third embodiment of the invention, at the time of dry cleaning treatment, generation of products at parts of the side surface and the reverse side of the semiconductor wafer SW is prevented by preventing dry cleaning gas from entering the reverse side of the semiconductor wafer SW. Therefore, it becomes unnecessary to perform the heating treatment of the semiconductor wafer SW by the showerhead 57c performed sequentially after the dry cleaning treatment in the first embodiment, namely, the heat treatment (FIG. 9C) in which the wafer stage 57a provided in the chamber 57 is lowered, and the wafer lift pins 57b are lifted to make the semiconductor wafer SW close to the showerhead 57c set to a temperature of 180° C. The product remaining over the principal surface of the semiconductor wafer SW by the dry cleaning treatment can be removed by heat treatment at a temperature higher than 150° C. in the chambers 55, 56 for heat treatment.

A method of dry cleaning treatment according to the third embodiment of the invention will be explained with reference to FIG. 17. FIG. 17A, FIG. 17B and FIG. 17C are respectively schematic cross-sectional views showing chambers for dry cleaning treatment provided in a deposition system of a barrier metal film.

FIG. 17A is a view explaining a first method of dry cleaning treatment for preventing generation of the product at parts of the side surface and the rear surface of the semiconductor wafer SW. The semiconductor wafer SW is placed over the wafer stage 57a, and a sealing 57e having a lifting and lowering mechanism is allowed to touch the periphery of the principal surface of the semiconductor wafer SW to press the wafer, thereby preventing dry cleaning gas from entering around the semiconductor wafer SW and entering the reverse side thereof.

FIG. 17B is a view explaining a second method of dry cleaning treatment for preventing generation of the product at parts of the side surface and the rear surface of the semiconductor wafer SW. The semiconductor wafer SW is placed on the wafer stage 57a having an electrostatic chuck function, therefore, dry cleaning treatment can be performed without forming a clearance between the rear surface of the semiconductor wafer SW and the wafer stage 57a. The electrostatic chuck is a mechanism in which a voltage is applied between the wafer stage 57a the semiconductor wafer SW by providing a dielectric layer over the wafer stage 57a to suck the semiconductor wafer SW by a force generated between the both. It is classified into a Coulomb force type and a Jhonsen Rahbek type using an insulating material as a dielectric depending on a suction manner. The Jhonson Rahbek type having strong suction force at low voltage is applied to an electrostatic chuck made of ceramic such as alumina, which is popular because it is advantageous in aspects of heat resistance and plasma resistance. Since a mechanical holding device is not used in the electrostatic chuck, it is possible to process the whole surface of the semiconductor wafer SW uniformly.

Furthermore, a shadow ring 57f having a lifting and lowering mechanism is provided at the periphery of the principal surface of the semiconductor wafer SW. The periphery of the semiconductor wafer SW is covered with the shadow ring 57f without touching the semiconductor wafer SW, and inert gas such as He gas is allowed to flow from around the wafer stage 57a to the upper direction. This prevents dry cleaning gas from entering around the semiconductor wafer SW and entering the reverse side thereof.

FIG. 17C is a view explaining a third method of dry cleaning treatment for preventing generation of the product at parts of the side surface and the rear surface of the semiconductor wafer SW. The semiconductor wafer SW is placed over the wafer stage 57a, and a sealing 57e having a lifting and lowering mechanism is allowed to touch the principal surface of the semiconductor wafer SW to press the wafer, thereby preventing dry cleaning gas from entering around the semiconductor wafer SW and entering the reverse side thereof.

Furthermore, an exhaust chamber 57g connecting to the sealing 57e is provided below the sealing 57e, and the wafer stage 57a is placed in the exhaust chamber 57g. In the exhaust chamber 57g, piping for introducing inert gas such as He gas into the exhaust chamber 57g and piping for exhausting the gas from the exhaust chamber 57g are provided, which is a structure in which inert gas is allowed to flow around the semiconductor wafer SW and into the rear surface thereof.

As described above, according to the third embodiment, the unnecessary product is not generated at parts of the side surface and the reverse side of the semiconductor wafer SW in the dry cleaning processing, and heating treatment of the semiconductor wafer SW by the showerhead 57c, continued from the dry cleaning treatment becomes unnecessary, therefore, the number of manufacturing steps can be reduced as compared with the first embodiment.

As described above, the invention made by the inventors has been specifically explained based on embodiments, and it goes without saying that the invention is not limited to the above embodiments but can be variously modified within a range not departing from the gist thereof.

The invention can be applied to manufacture of a semiconductor device having a step of embedding a metal film after performing dry cleaning treatment to insides of connection holes opening at an insulating film.

What is claimed is:

1. A method of manufacturing a semiconductor device in which a metal film is embedded inside connection holes opening in an insulating film through a barrier metal film; before depositing the barrier metal film inside the connection holes after forming the connection holes in the insulating film, comprising:
   (a) placing a semiconductor wafer over a wafer stage provided in a first chamber;
   (b) performing dry cleaning treatment to insides of the connection holes by supplying reducing gas, which is excited by a plasma, through a showerhead set above the wafer stage;
   (c-1) after (b) performing the dry cleaning treatment, lifting the semiconductor wafer from the wafer stage in order to position a principal surface of the semiconductor wafer closer to the showerhead than when the semiconductor wafer is on the wafer stage;
   (c-2) performing a first heat treatment to the semiconductor wafer at a first temperature utilizing a heating temperature of the showerhead;
   (d) transferring the semiconductor wafer from the first chamber to a second chamber; and
   (e) performing a second heat treatment to the semiconductor wafer at a second temperature higher than the first temperature in the second chamber.

2. The method of manufacturing the semiconductor device according to claim 1,
   wherein the first temperature is 100 to 150° C.

3. The method of manufacturing the semiconductor device according to claim 1,
   wherein the second temperature is 150 to 400° C.

4. The method of manufacturing the semiconductor device according to claim 1,
   wherein the second temperature is 165 to 350° C.

5. The method of manufacturing the semiconductor device according to claim 1,
   wherein the second temperature is 180 to 220° C.

6. The method of manufacturing the semiconductor device according to claim 1,
   wherein the second temperature is 200° C.

7. The method of manufacturing the semiconductor device according to claim 1,
   wherein transfer of the semiconductor wafer between the first chamber and the second chamber is performed by vacuum transfer.

8. The method of manufacturing the semiconductor device according to claim 1,
   wherein the metal film is a tungsten film, and the barrier metal film is a stacked film in which a titanium nitride film is stacked over a titanium film or a tungsten nitride film.

9. The method of manufacturing the semiconductor device according to claim 1,
   wherein the metal film is a copper film, and the barrier metal film is a titanium nitride film, a tantalum nitride film, a stacked film in which a tantalum film is stacked over the tantalum nitride film or a stacked film in which a ruthenium film is stacked over the tantalum nitride film.

10. The method of manufacturing the semiconductor device according to claim 1,
    wherein the metal film is an aluminum film, and the barrier metal film is a stacked film in which a titanium nitride film is stacked over a titanium film or a tungsten nitride film.

11. The method of manufacturing the semiconductor device according to claim 1, wherein in (b) performing the dry cleaning treatment, the semiconductor wafer is positioned 17.8±5.1 mm from the showerhead, and in (c-2) performing the first heat treatment, the semiconductor wafer is 3.8±2.6 mm from the showerhead.

* * * * *